US012719009B2

(12) United States Patent
Vašina et al.

(10) Patent No.: US 12,719,009 B2
(45) Date of Patent: Aug. 25, 2026

(54) OBJECTIVE LENSES, CHARGED PARTICLE MICROSCOPES INCLUDING THE SAME, AND ASSOCIATED METHODS

(71) Applicant: FEI Company, Hillsboro, OR (US)

(72) Inventors: Radovan Vašina, Brno (CZ); Bohuslav Sed'a, Blansko (CZ); Marek Uncovský, Bílovice and Svitavou (CZ); Magdalena Špoková, Ostrava (CZ)

(73) Assignee: FEI Company

( * ) Notice: Subject to any disclaimer, the term of this patent is extended or adjusted under 35 U.S.C. 154(b) by 353 days.

(21) Appl. No.: 18/534,547

(22) Filed: Dec. 8, 2023

(65) Prior Publication Data

US 2025/0191873 A1 Jun. 12, 2025

(51) Int. Cl.

| | |
|---|---|
| ***H01J 37/12*** | (2006.01) |
| ***H01J 37/09*** | (2006.01) |
| ***H01J 37/26*** | (2006.01) |
| ***H01J 37/28*** | (2006.01) |

(52) U.S. Cl.

CPC .............. *H01J 37/12* (2013.01); *H01J 37/09* (2013.01); *H01J 37/265* (2013.01); *H01J 37/28* (2013.01)

(58) Field of Classification Search

CPC .......... H01J 37/12; H01J 37/09; H01J 37/265; H01J 37/28; H01J 37/10; H01J 37/145; H01J 37/21; H01J 2237/0262

USPC ................................ 250/306, 307, 310, 311

See application file for complete search history.

(56) References Cited

U.S. PATENT DOCUMENTS

| | | | | |
|---|---|---|---|---|
| 8,710,454 | B2 | 4/2014 | Chen | |
| 9,443,692 | B2 | 9/2016 | Maazouz | |
| 2018/0061613 | A1 * | 3/2018 | Sed'a .................. | H01J 37/1413 |

* cited by examiner

*Primary Examiner* — Michael Maskell

(74) *Attorney, Agent, or Firm* — Leron Vandsburger

(57) ABSTRACT

Objective lenses, charged particle microscopes including the same, and associated methods are disclosed herein. An objective lens can include a lens body, a shielding electrode, and a steering electrode. The objective lens is configured such that varying a steering electrode voltage adjusts a location of a main objective plane of the objective lens to vary a focal working distance of the objective lens. A method can include positioning a sample relative to an objective lens and operating the objective lens to focus a charged particle beam to a focus location.

20 Claims, 9 Drawing Sheets

204
206
252
208
238
269
272
214
215
210
260
267
266
211
218, 219
216
212
202
251
270
264
244
213
242
268
261
262
224
263
250

OBJECTIVE LENSES, CHARGED PARTICLE MICROSCOPES INCLUDING THE SAME, AND ASSOCIATED METHODS

FIELD

The present disclosure relates generally to objective lenses for focusing charged particle beams of charged particle microscope systems, and associated methods.

BACKGROUND

Probe systems for evaluating the performance of electrical devices can include probes that are brought into proximity and/or contact with localized test locations on such devices. Such probes can be used to transmit test signals to the devices and/or receive test signals from the devices. With decreasing physical dimensions of such sample devices, it becomes necessary to position such probes with correspondingly increased precision. Accordingly, probe systems often employ charged particle microscope (CPM) systems such as scanning electron microscope (SEM) systems to assist in positioning probes relative to sample test locations. In such examples, it is desirable to limit the landing energy of the charged particles (e.g., electrons) upon the sample device to protect the sample device from adverse effects from the charged particles.

SUMMARY

In a representative example, an apparatus includes an objective lens with a lens body, a shielding electrode disposed within a downstream end region of the lens body, and a steering electrode disposed within the downstream end region of the lens body and upstream of the shielding electrode. The lens body extends circumferentially around a lens central axis of the objective lens. The shielding electrode is configured to at least partially shield a test region downstream of the objective lens from a lens electrostatic field generated within the objective lens. The objective lens is configured such that varying a steering electrode voltage that is applied to the steering electrode adjusts a location of a main objective plane of the objective lens in a downstream direction to increase a focal working distance of the objective lens.

In some examples, the apparatus further includes a charged particle source configured to emit a charged particle beam along an optical axis and toward a sample, and the objective lens is configured to focus the charged particle beam to a focus location corresponding to a location of the sample.

In another representative example, an objective lens includes a shielding electrode and a steering electrode. The objective lens is configured to generate a lens electrostatic field to at least partially direct a charged particle beam along an optical axis to a focus location with a landing energy, as measured at the focus location, that is at most 100 electron-volts (eV). The shielding electrode is configured to at least partially shield a test region downstream of the objective lens such that the lens electrostatic field has an axial electric field strength, as measured at the focus location in a direction parallel to the optical axis, that is at most 150 volts per millimeter (V/mm). The steering electrode is configured to generate at least a portion of the lens electrostatic field such that the objective lens operates with a focal working distance, as measured between the objective lens and the focus location along a direction parallel to a lens central axis of the objective lens, that is 1-3 millimeters (mm).

In another representative example, a method includes positioning a sample relative to an objective lens that is configured to focus a charged particle beam to a focus location and operating the objective lens. The objective lens includes a lens body, a shielding electrode disposed within a downstream end region of the lens body, and a steering electrode disposed within the downstream end region of the lens body and upstream of the shielding electrode. The lens body extends circumferentially around a lens central axis of the objective lens. The shielding electrode is configured to at least partially shield a test region downstream of the objective lens from a lens electrostatic field generated within the objective lens. The operating the objective lens includes controlling a focal working distance between the objective lens and the focus location by applying a steering electrode voltage to the steering electrode.

The foregoing and other objects, features, and advantages of the disclosed technology will become more apparent from the following detailed description, which proceeds with reference to the accompanying figures.

DETAILED DESCRIPTION

Figure 1:
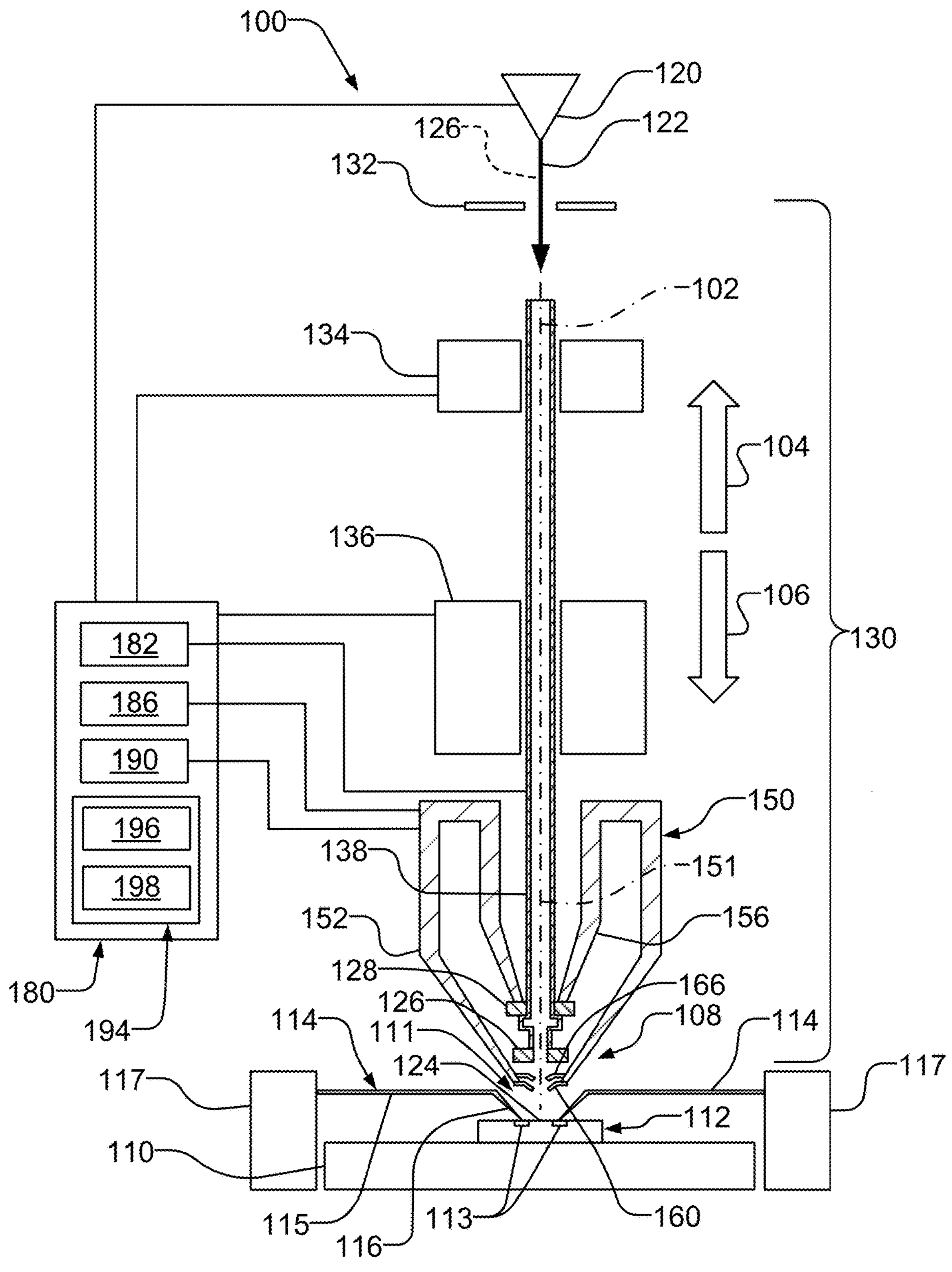
FIG. 1 is a schematic illustration of a CPM system according to an example.

The present disclosure generally is directed to CPM systems for imaging a sample, such as may be used to facilitate positioning a sample probe with nanometer-scale precision relative to a test location on the sample. For example, electrical fault analysis (EFA) of state-of-the-art integrated circuits commonly involves positioning one or more sample probes near, or in contact with, sample test locations of a sample that can have a characteristic dimension of less than 10 nanometers (nm). To position such sample probes with such precision, CPM systems such as SEM systems can be used to produce an image of the sample probes and/or the sample test locations, thus enabling a user to visually determine and/or confirm a location of the sample probes relative to the sample test locations. An SEM system can employ an electrostatic and/or magnetic objective lens to focus a charged particle beam to a target focus location.

In the present disclosure, the term "sample" can refer to any of a variety of devices, components, and/or materials to which a charged particle beam may be directed, such as for imaging thereof. For example, in the context of EFA, the sample can include and/or be an electrical device, such as a semiconductor substrate that supports electrical circuits to be tested. In such examples, the term "sample" also may be understood as encompassing any other components to be imaged during EFA, such as a portion of the sample probes proximate to the device under test.

When performing EFA, it generally is desirable to limit a landing energy with which the electron beam impacts the sample to avoid damaging the sample with the electron beam. For example, the desired landing energy of the electron beam may be in the range 50-200 electron-volts (eV). Low-energy electron beams, however, can be susceptible to dispersion due to Coulombic interactions, stray fields, and charging effects in the SEM optical column. Such effects can be mitigated with the use of a booster tube in the SEM optical column that accelerates the electron beam within the booster tube and that decelerates the electron beam as the beam exits the booster tube. The booster tube can effectively operate as an electrode of the objective lens with an associated electrostatic field that decelerates and/or focuses the electron beam downstream of the booster tube.

Operation of the objective lens can be characterized by a working distance separating the objective lens and the target focus location and/or by a focal length separating a main objective plane of the objective lens and the target focus location. It generally is desirable to configure the objective lens such that the working distance is sufficiently large to accommodate the sample probe(s) between the objective lens and the sample. In some examples, however, the presence of the booster tube can limit the working distance and/or the focus of the electron beam at the target focus location. For example, the electrostatic field generated by the booster tube to decelerate electrons downstream of the booster tube also operates to focus the electron beam, thus creating an electrostatic lens. The electrostatic lens associated with the booster tube can cause the focus point of the electron beam to be undesirably close to the objective lens, thus limiting the maximum attainable operative working distance of the objective lens.

Limiting the working distance in this manner can result in the focusing properties of the objective lens being primarily influenced by the electrostatic field generated by the objective lens rather than by the magnetic field generated by the objective lens. In some examples, the magnetic field lensing offers enhanced optical properties relative to the electrostatic lensing, such that limiting the working distance also adversely affects the overall optical quality of the focused electron beam.

In the present disclosure, the term "working distance" can refer to a distance between the objective lens and the focus location and/or a distance between the objective lens and a surface of the sample upon which the electron beam is focused. In various examples, however, the surface of the sample may not be positioned precisely at the focus location. Additionally, it may be desirable to characterize the optical properties of the objective lens in terms of a working distance even when the objective lens is not positioned proximate to a sample. Accordingly, in the present disclosure, the term "focal working distance" generally refers to a distance between the objective lens and the focus location while the term "sample working distance" generally refers to a distance between the objective lens and a sample during operative use of the objective lens as described herein.

Additionally, as used herein, the term "attainable operative working distance" refers to a focal working distance and/or a sample working distance that can be realized and/or used during operative use of the objective lens as described herein. For example, while the focal working distance generally may be described as representing the distance separating the objective lens and the target focus location, there may exist a limited range of focal working distances at which the objective lens can operate to produce the desired charged particle beam characteristics. Accordingly, the term "attainable operative working distance" may be understood as representing a working distance that can be attained and/or used while the objective lens focuses the charged particle beam to the focus location and/or to the sample with desired and/or intended properties as discussed herein (e.g., landing energy, characteristic beam diameter, axial electric field strength at the sample, etc.).

The electrostatic field associated with the booster tube can protrude beyond a downstream end of the objective lens and into a region occupied by the sample probe(s). In such examples, the sample probe(s) can interact with this electrostatic field to introduce perturbations and/or asymmetries in the field that can adversely affect the beam-focusing properties of the objective lens.

Some examples of objective lenses include a shielding electrode to at least partially shield the sample probe(s) from the electrostatic field generated by the objective lens. For example, such a shielding electrode can limit a magnitude of the electrostatic field that extends downstream of the electrostatic lens. By restricting an extent of the electrostatic field downstream of the objective lens, however, such shielding electrodes can undesirably limit the maximum attainable operative working distance of the objective lens. For example, such shielding electrodes can operate to concentrate the electrostatic field in the region of the shielding electrode, thus yielding a strong electrostatic lensing effect in the region of the shielding electrode. The use of SEM to produce an electron beam with a low landing energy thus can introduce a variety of practical constraints, which in turn can require that corresponding compromises be made in configuring a probe system.

By contrast, CPM systems according to the preset disclosure can include electrostatic and/or magnetic objective lenses that include a plurality of electrodes that collectively operate to limit the protrusion of electrostatic fields downstream of the objective lens. Such objective lenses also can operate to enhance the attainable operative working distance of the lens, such as by increasing the focal working distance of the lens. In particular, and as discussed in more detail below, such objective lenses can include a shielding electrode in combination with a steering electrode that operates to shift a main objective plane of the objective lens in a downstream direction, thereby increasing the focal working distance without significantly compromising the beam focus properties.

FIG. 1 is a schematic representation of an example of a CPM system 100 according to the present disclosure. The CPM system 100 can include a charged particle source 120, a sample holder 110 configured to support a sample 112, and a beam directing system 130. The charged particle source 120 can generate and/or emit a charged particle beam 122 along an optical axis 102 toward the sample 112, while the beam directing system 130 can shape, modulate, focus, and/or direct the charged particle beam 122 to the sample 112.

The CPM system 100 can represent an example of any of a variety of CPM systems. In particular, the present disclosure generally is directed to examples in which the CPM system 100 includes and/or is a SEM system in which the charged particle beam 122 is an electron beam 122 that is guided to and focused onto the sample 112 by the beam directing system 130. In such examples, the (focused) electron beam 122 can interact with the sample 112 in such a manner as to cause various types of "stimulated" radiation to emanate from the sample 112, including (for example) secondary electrons, backscattered electrons, X-rays, and/or and optical radiation (cathodoluminescence). In an example in which the charged particle beam 122 is an electron beam 122, the charged particle source 120 also may be referred to as an electron source and/or an electron emitter.

While the present disclosure generally relates to examples in which the CPM system 100 is an SEM system, this is not required of all examples, and it additionally is within the scope of the present disclosure that the systems and apparatuses disclosed herein can be used in conjunction with any suitable CPM configuration, examples of which include a transmission electron microscope (TEM), a scanning transmission electron microscope (STEM), a focused ion beam (FIB) system, etc. For example, the systems and apparatuses disclosed herein also may be used in conjunction with a dual-beam CPM system, such as a system that includes a SEM system and a FIB system to direct multiple charged particle beams to a sample that is inclined relative to one or more of the charged particle beams.

The beam directing system 130 can include any of a variety of components and/or elements for operating upon the charged particle beam 122. For example, and as shown in FIG. 1, the beam directing system 130 can include an aperture 132 configured to limit an angular extent of the charged particle beam 122, a condenser lens 134 configured to manipulate the charged particle beam 122 toward the sample 112, and/or one or more scan coils 136 configured to deflect the charged particle beam 122. In various examples, the beam directing system 130 additionally or alternatively can include illuminators, objective lenses, projection lenses, condenser lenses, electrostatic/magnetic lenses, deflectors (e.g., scan coils), correctors (such as stigmators), etc. in any suitable combinations.

The beam directing system 130 additionally can include a booster tube 138 configured to energize the charged particle beam 122 as the charged particle beam 122 passes through the booster tube 138. In particular, the booster tube 138 may be maintained at a booster tube voltage such that the booster tube generates an associated electrostatic field that energizes the charged particle beam 122 within the booster tube 138. As a more specific example, the charged particle beam 122 can be an electron beam, and the booster tube 138 can be maintained at a positive voltage (e.g., approximately 8000 V) to accelerate the electron beam within the booster tube 138.

Upon exiting the booster tube 138, the electrostatic field generated by the booster tube and extending downstream of the booster tube can decelerate the charged particle beam 122. In this manner, the booster tube 138 can produce a charged particle beam 122 downstream of the booster tube 138 with a sufficiently small landing energy to avoid damaging sensitive components of the sample 112 while maintaining the charged particle beam 122 at sufficiently high energy within the beam directing system 130 to avoid dispersion due to Coulombic interactions and/or charging effects. As used herein, the booster tube 138 additionally or alternatively may be referred to as an accelerator tube 138. Additional examples of booster tubes that may be used in conjunction with the systems and apparatuses of the present disclosure are disclosed in U.S. Pat. No. 9,443,692, the complete disclosure of which is incorporated by reference herein.

In practice, the landing energy of the charged particle beam 122 can be selected and/or varied via corresponding variation of the source energy of the charged particle beam 122 emitted by the charged particle source 120. In particular, the landing energy of the charged particle beam 122 may be equal to the difference between the source energy of the charged particle beam 122 at the charged particle source 120 and a bias voltage applied to the sample 112. When performing EFA, however, it may be desirable to maintain the sample 112 at an electrical ground to avoid damaging the sample 112 and/or otherwise interfering with the EFA analysis. Accordingly, in such examples, the landing energy of the charged particle beam 122 may be primarily and/or exclusively determined by and/or equal to the source energy at which the charged particle source 120 emits the charged particle beam 122. Because the electrostatic field generated by the booster tube 138 is a conservative field, the net effect of the booster tube 138 on the landing energy (e.g., relative to the source energy) may be negligible.

As used herein, terms such as "upstream" and "downstream" are intended to refer to directions relative to the propagation of the charged particle beam 122. For example, and as shown in FIG. 1, various components, features, etc. of the CPM system 100 may be described with reference to an upstream direction 104 and/or a downstream direction 106. The upstream direction 104 is directed generally toward the charged particle source 120 and/or away from the sample holder 110, while the downstream direction 106 is directed generally toward the sample holder 110 and/or away from the charged particle source 120.

As shown in FIG. 1, The beam directing system 130 also includes an objective lens 150 that operates to direct (e.g., converge and/or focus) the charged particle beam 122 to a focus location 124 (e.g., a location on or near the sample 112). The objective lens 150 can operate to focus the charged particle beam 122 by generating one or more electrostatic and/or magnetic fields that deflect rays of the charged particle beam 122 toward a common focus location (e.g., the focus location 124). In particular, the objective lens 150 can be configured to generate a lens electrostatic field to at least partially direct and/or focus the charged particle beam 122 to the focus location 124.

In various examples, the objective lens 150 also is configured to generate a lens magnetic field to at least partially direct and/or focus the charged particle beam 122 to the focus location 124. In particular, the present disclosure generally is related to examples in which focusing is performed with a suitable combination of independently controlled electrostatic and magnetic fields. Such a configuration may be preferable, for example, as magnetic focusing can offer enhanced optical properties of the focused charged particle beam 122 (e.g., smaller aberrations) relative to purely electrostatic focusing. Thus, while the present disclosure describes the lens electrostatic field in the context of focusing of the charged particle beam 122, such descriptions do not preclude the existence and/or use of an additional lens magnetic field generated by the objective lens 150 that operates to focus the charged particle beam 122. Accordingly, in the present disclosure, the objective lens 150 additionally or alternatively may be referred to as a compound lens 150, a compound objective lens 150, a compound electrostatic and magnetic lens 150, and/or as a compound electrostatic and magnetic objective lens 150. This is not required, however, and it additionally is within the scope of the present disclosure that the objective lens 150 can be a purely electrostatic lens.

The focus location 124 can include, be, and/or correspond to any location (e.g., a point, a region, a line, a plane, a volume, etc.) at which the charged particle beam is sufficiently focused upon the sample 112 and/or another component of the CPM system 100 as described herein. As an example, the focus location 124 can include and/or be a focal point and/or a focal plane associated with the objective lens 150. Accordingly, as used herein, the focus location 124 additionally or alternatively may be referred to as a focal point 124 and/or as a focal plane 124. In examples in which the focus location 124 includes at least a portion of a focal plane, it is to be understood that such a focal plane is not necessary perfectly planar. For example, the focal plane may be subject to field curvature associated with the objective lens 150. In some examples, the focus location 124 additionally or alternatively can correspond to a location (e.g., a location along the optical axis 102) at which the charged particle beam 122 exhibits a minimum diameter and/or a minimum degree of optical aberrations.

As shown in FIG. 1, the objective lens 150 can include a lens body 152 extending circumferentially around a lens central axis 151 of the objective lens 150. The pole piece 152 can form at least a portion of an exterior surface of the objective lens 150. In some examples, the lens body 152 can include and/or be a pole piece that is configured to shape and/or direct a magnetic field generated by the objective lens 150 to at least partially focus the charged particle beam 122 to the focus location 124. In such examples, the lens body 152 also may be referred to as a pole piece 152. In some such examples, and as shown in FIG. 1, the pole piece 152 is a first pole piece 152, and the objective lens 150 and/or the lens body additionally includes a second pole piece 156 positioned radially interior of the first pole piece 152, which in turn may be associated with a second magnetic field generated by the objective lens 150.

The CPM system 100 can include one or more electron detectors configured to detect electrons emitted from the sample 112. For example, and as shown in FIG. 1, the CPM system 100 can include a backscattered electron detector 126 configured to detect backscattered electrons and/or a secondary electron detector 128 configured to detect secondary electrons emitted from the sample 112.

As shown in FIG. 1, each of the backscattered electron detector 126 and the secondary electron detector 128 can be positioned within and/or supported by the objective lens 150, such as proximate to and/or supported by the booster tube 138. In particular, the electrostatic field generated by applying a positive booster tube voltage to the booster tube 138 can operate to accelerate free electrons toward and/or to the backscattered electron detector 126 and/or the secondary electron detector 128.

While FIG. 1 illustrates each electron detector as being positioned within the objective lens 150, this is not required, and it is to be understood that the CPM system 100 additionally or alternatively can include any other suitable charged particle detectors and/or electron detectors. For example, the CPM system 100 can include one or more electron detectors positioned exterior to the objective lens 150.

A measurement characterizing the electrons incident upon the backscattered electron detector 126 and/or the secondary electron detector 128 (e.g., characterizing the intensity and/or energy of such detected electrons) can provide an indication of various physical properties of the sample 112, such as a geometrical structure of the sample 112 and/or a chemical composition of the sample 112 at a location upon which the electron beam 122 is incident upon the sample 112 (e.g., at the focus location 124). Such measurements thus may be used to form an image (e.g., a graphical representation) of the sample at the focus location. A spatial resolution with which the CPM system 100 can characterize the sample 112 thus is at least partially based upon a minimum size (e.g., a minimum diameter) of the electron beam 122 in a plane corresponding to a location at which the sample 112 is located.

Scanning the electron beam 122 across a surface of the sample 112 thus can yield an image and/or other representation of the sample 112 in the region scanned. Such scanning may be accomplished in any suitable manner. For example, the scan coils 136 can operate to deflect the electron beam 122 to scan the charged particle beam 122 across the sample 112 and/or to move the focus location 124 relative to the sample 112. Additionally or alternatively, the sample holder 110 can be configured to rotate and/or translate the sample 112 through one or more dimensions to move the sample 112 relative to the focus location 124. Such translation of the sample 112 and/or scanning of the electron beam 122 thus can allow selected portions of the sample 112 to be irradiated/imaged/inspected by the electron beam 122 traveling along the optical axis 102.

As shown in FIG. 1, the booster tube 138 can extend at least partially within the objective lens 150. As discussed above, applying the booster tube voltage to the booster tube 138 can yield an electrostatic field that can protrude from the objective lens 150 and into a test region 111 downstream of the objective lens 150. The electrostatic field generated by the booster tube 138 can represent at least a portion of the lens electrostatic field.

In various examples, it can be desirable to limit a magnitude of the lens electrostatic field downstream of the objective lens 150 and/or within the test region 111. For example, and as shown in FIG. 1, the CPM system 100 additionally can include one or more sample probes 114 configured to be positioned proximate to corresponding sample test locations 113 of the sample 112. The sample probes 114 and/or the sample test locations 113 can be positioned at least partially within the test region 111. As used herein, the sample probes 114 additionally or alternatively may be referred to as nanoprobes 114.

As shown in FIG. 1, each sample probe 114 can include a probe tip 116 configured to be positioned proximate to a corresponding sample test location 113 of the sample 112 and a probe beam 115 extending away from the probe tip 116. In the example of FIG. 1, each probe tip 116 is configured to directly contact the corresponding sample test location 113, such as to establish electrical contact with the sample test location 113. In other examples, each sample probe 114 and/or the probe tip 116 thereof can be configured as a non-contact probe (e.g., an optical probe configured to be optically coupled to the sample test location 113) that is configured to be brought into proximity with the corresponding sample test location 113 without directly contacting the sample test location 113.

Each sample probe 114 can be moved (e.g., translated and/or rotated) relative to the sample 112 in any suitable manner. For example, and as shown in FIG. 1, the probe beam 115 of each sample probe 114 can be supported by a corresponding probe manipulator 117 that is configured to move the sample probe 114 relative to the sample 112 to position the sample probe 114 proximate to the sample test location 113. Additionally or alternatively, the sample holder 110 can include and/or be a motion stage that is configured to move (e.g., translate and/or rotate) the sample 112 relative to the sample probes 114.

In the absence of such sample probes 114, the lens electrostatic field extending within the test region 111 may remain sufficiently symmetric about the optical axis to allow for the lens electrostatic field to focus the charged particle beam 122 in a controlled and precise manner. In an example in which the sample probes 114 extend within the test region 111, however, the sample probes 114 can interact with the lens electrostatic field in a manner that generates asymmetries in, and/or that otherwise perturbs, the lens electrostatic field. Such perturbations can adversely affect the focusing properties of the lens electrostatic field within the test region 111, which in turn can yield an undesirably spot size of the charged particle beam 122 at the focus location 124. Thus, in such examples, it can be desirable to limit a magnitude of the lens electrostatic field within the test region 111 to preserve and/or enhance the focusing properties of the lens electrostatic field.

Accordingly, and as shown in FIG. 1, the objective lens 150 includes a shielding electrode 160 configured to at least partially shield the test region 111 from the lens electrostatic field generated within the objective lens 150 (e.g., by the booster tube 138). In particular, the shielding electrode 160 can be configured to at least partially shield the sample probes 114 from the lens electrostatic field. The shielding electrode 160 can be disposed within a downstream end region 108 of the objective lens 150 and/or of the lens body 152. In particular, and as shown in FIG. 1, the shielding electrode can be positioned at or near a downstream end of the objective lens 150.

The shielding electrode 160 can operate to limit protrusion of the lens electrostatic field downstream of the objective lens 150 in any of a variety of manners. For example, the shielding electrode 160 can be configured to be maintained at an electrical ground to at least partially restrict the lens electrostatic field from protruding into the test region 111. In such examples, grounding the shielding electrode 160 can increase a magnitude of the lens electrostatic field at or near the shielding electrode 160, yielding a strong focusing effect that operates to limit an attainable operative working distance of the objective lens 150.

As shown in FIG. 1, the objective lens 150 additionally includes a steering electrode 166 positioned upstream of the shielding electrode 160. As discussed in more detail below, the steering electrode 166 can operate to increase the focal working distance of the objective lens 150 to at least partially offset the effect of the shielding electrode 160 on the attainable operative working distance. In particular, the objective lens 150 can be configured such that applying a steering electrode voltage to the steering electrode 166 and/or varying the steering electrode voltage that is applied to the steering electrode 166 operates to control and/or vary the focal working distance.

As shown in FIG. 1, the CPM system 100 further can include a controller 180 that is programmed and/or otherwise configured to at least partially control operation of the CPM system 100. For example, the controller 180 can at least partially control operation of the charged particle source 120 to produce the charged particle beam 122 and/or can at least partially control operation of at least a portion of the beam directing system 130. Additionally or alternatively, the controller 180 can receive a signal from the backscattered electron detector 126 and/or from the secondary electron detector 128 that is representative of electrons that are emitted from a surface of the sample 112, which may be used to produce an image and/or other representation of the sample 112.

In some examples, the controller 180 also can at least partially control operation of the objective lens 150, such as by selectively and dynamically controlling and/or varying the booster tube voltage and/or the steering electrode voltage. This may be accomplished by regulating one or more electrical signals (e.g., voltages) that are delivered to the objective lens 150. For example, and as shown in FIG. 1, the controller 180 may include a first voltage source 182 that is configured to apply the booster tube voltage to the booster tube 138. In particular, the first voltage source 182 may be configured to convey a first electrical signal 184 to the booster tube 138 that applies the booster tube voltage to the booster tube 138.

Additionally or alternatively, the controller 180 may include a second voltage source 186 configured apply the steering electrode voltage to the steering electrode 166. In particular, the second voltage source 186 may be configured to convey a second electrical signal 188 to the steering electrode 166 that applies the steering electrode voltage to the steering electrode 166.

In some examples, the controller 180 further may be configured to control and/or regulate a shielding electrode voltage this is applied to the shielding electrode 160 and/or at which the shielding electrode 160 is maintained. For example, the controller 180 can include a third voltage source 190 configured to convey a third electrical signal 192 to the shielding electrode 160. In some examples, the third voltage source 190 and/or the third electrical signal 192 can include and/or be an electrical ground. This is not required of all examples, however, and it additionally is within the scope of the present disclosure that the third voltage source 190 can maintain the shielding electrode 160 at any suitable voltage.

As described herein, the controller 180 may be programmed and/or configured to control and/or vary the first electrical signal 184, the second electrical signal 188, and/or the third electrical signal 192 to at least partially control operation of the objective lens 150, such as to adjust a focal working distance and/or other focus properties of the objective lens 150.

As shown in FIG. 1, the controller 180 can include a user interface 194 for receiving inputs from a human user and/or for recording and/or displaying information. In particular, the user interface 194 can include one or more input devices 196 and/or one or more output devices 198. The one or more input devices 196 can include and/or be any suitable devices for receiving inputs form a human user to at least partially direct operation of the CPM system 100, such as a keyboard, a mouse, a display, a touchscreen, etc. The one or more output devices 198 can include and/or be any suitable devices for conveying information to a human user, such as a display, a touchscreen, a physical storage drive, etc.

The controller 180 can include any of a variety of modules (e.g., hardware and/or software) for performing these and other functions. In some examples, the controller 180 is a single device that includes each of the constituent components described herein. In other examples, the controller 180 can refer to and/or encompass a collection of components that may be at least partially spatially separated. The controller 180 can be connected to any other suitable components of the CPM system 100 in any suitable manner, such as via one or more control lines and/or via wireless connections. As examples, such control lines can include and/or be physical signal conduits, such as wires, electrical buses, optical fibers, etc.

Figure 2:
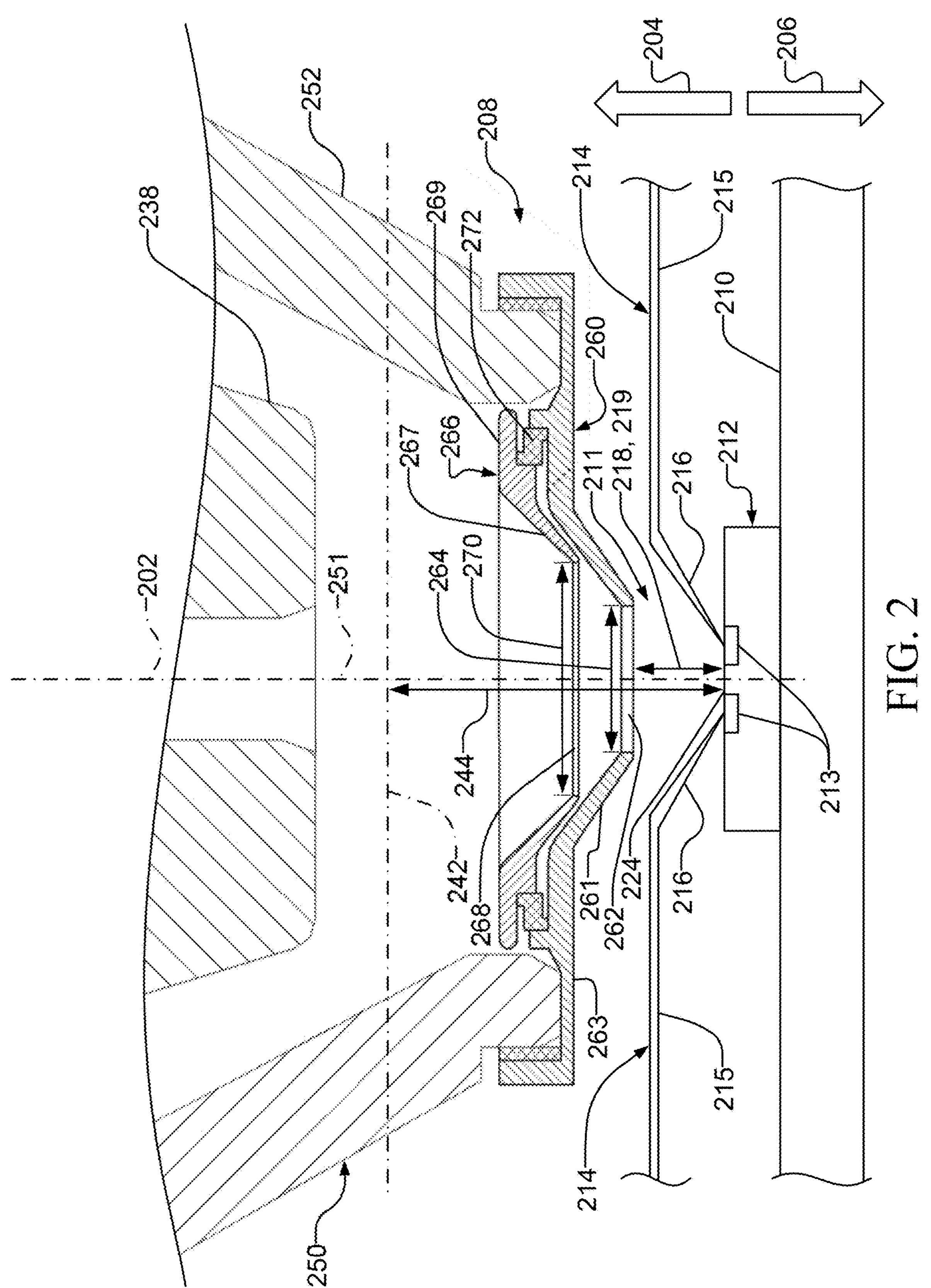
FIG. 2 is a cross-sectional illustration of an objective lens positioned relative to a sample and a pair of sample probes according to an example.

FIG. 2 illustrates aspects of an objective lens 250 positioned adjacent to a sample 212 and a plurality of sample probes 214. The objective lens 250 of FIG. 2 is substantially similar to the objective lens 150 of FIG. 1 and may be described as representing an example of the objective lens 150 of FIG. 1. Accordingly, like reference numerals are used to label like components in FIGS. 1-2. Specifically, unless otherwise stated, all illustrated components of FIG. 2, labeled or unlabeled, can share any suitable features, characteristics, attributes, etc. with the corresponding components of FIG. 1. For those components labeled in FIG. 2, components labeled with a reference numeral of the form "2XX" are intended to correspond with the components labeled with a reference numeral of the form "1XX" in FIG. 1. For example, sample 212 of FIG. 2 corresponds to, and may be at least substantially identical to, the sample 112 of FIG. 1.

As shown in FIG. 2, the shielding electrode 260 and the steering electrode 266 are disposed within the downstream end region 208 of the lens body 252, with the steering electrode 266 being positioned upstream of the shielding electrode 260. The booster tube 238 extends around the lens central axis 251 upstream of each of the shielding electrode 260 and the steering electrode 266. In this manner, each of the shielding electrode 260 and the steering electrode 266 can operate to modulate a portion of the lens electrostatic field that is generated by the booster tube 238 and that extends toward and/or into the test region 211.

As discussed above, the shielding electrode 260 may be described as operating to at least partially shield the test region 211 and/or the sample probes 214 from the lens electrostatic field and/or a portion thereof generated by the booster tube 238. With reference to FIG. 2, the operation of the steering electrode 266 may be characterized with respect to a focal working distance 218 of the objective lens 250 and/or a focal length 244 of the objective lens 250. In particular, as shown in FIG. 2, the focal working distance 218 may be described as representing the distance between the downstream-most portion of the objective lens 250 (e.g., the shielding electrode 260) and the focus location 224 when the objective lens 250 operates to focus the charged particle beam to the focus location 224.

As shown in FIG. 2, the operation of the objective lens 250 additionally or alternatively may be characterized with reference to a sample working distance 219. In particular, the sample working distance 219 may be described as representing the distance between the downstream-most portion of the objective lens 250 (e.g., the shielding electrode 260) and a portion (e.g., surface) of the sample 212 to which the objective lens 250 directs the charged particle beam. In the example of FIG. 2, a surface of the sample 212 is positioned at the focus location 224, such that the focal working distance 218 is equal to the sample working distance 219. This is not required of all examples, however, and it also is within the scope of the present disclosure that the focal working distance 218 may be different than the sample working distance 219, such as when the sample 212 is not positioned at the focus location 224. The focal working distance 218, the sample working distance 219, and/or the focal length 244 may be measured along a direction parallel to the optical axis 202 and/or the lens central axis 251.

The focal working distance 218 characterizing operation of the objective lens 250 may be related to the focal length 244 of the objective lens 250, which in turn corresponds to a distance between the focus location 224 and a main objective plane 242 of the objective lens 250. As shown in FIG. 2, the main objective plane 242 may be described as a plane extending perpendicular to the optical axis 202 and intersecting the optical axis 202. As described herein, the location at which the main objective plane 242 intersects the optical axis 202 can vary based upon operational characteristics of the objective lens 250.

In various examples, the steering electrode 266 operates to adjust the location of the main objective plane 242 relative to the objective lens 250. For example, applying an increasingly positive steering electrode voltage to the steering electrode 266 can operate to adjust and/or shift the main objective plane 242 in the downstream direction 206. This may be performed while maintaining the focal length 244 at a constant, or at least substantially constant, value. As a result, shifting the main objective plane 242 in the downstream direction also can operate to shift the focus location 224 in the downstream direction, thereby increasing the focal working distance 218.

In some examples, the steering electrode 266 additionally or alternatively can operate to limit the landing energy of the charged particle beam at the sample 212. In particular, similar to the positive booster tube voltage applied to the booster tube 238, applying a positive steering electrode voltage to the steering electrode 266 can generate an electrostatic field that operates to decelerate electrons propagating downstream of the steering electrode 266.

The shielding electrode 260 and the steering electrode 266 each may have any suitable form and/or structure. For example, and as shown in FIG. 2, the shielding electrode 260 can include a shielding electrode aperture 262 through which the lens central axis 251 and/or the optical axis 202 extends. Similarly, the steering electrode 266 can include a steering electrode aperture 268 through which the lens central axis 251 and/or the optical axis 202 extends.

Either or both of the shielding electrode 260 and/or the steering electrode 266 can extend circumferentially around the lens central axis 251 (e.g., fully circumferentially around the lens central axis 251) and/or can be circumferentially symmetric about the lens central axis 251. In particular, configuring the shielding electrode 260 and/or the steering electrode 266 to be circumferentially symmetric about the lens central axis 251 can facilitate generating a lens electrostatic field that similarly is at least substantially circumferentially symmetric about the lens central axis 251.

In various examples, the shielding electrode 260 is shaped to correspond to a shape and/or configuration of the sample probes 214. For example, and as shown in FIG. 2, the probe tip 216 of each sample probe 214 can be angled relative to the probe beam 215 toward the sample holder 210 and/or the sample 212. Thus, while the presence of the probe beams 215 can restrict the objective lens 250 from being positioned arbitrarily close to the sample 212, the deflection of the probe tips 216 toward the sample 212 can produce a region in which a central portion of the objective lens 250 may be positioned nearer to the sample 212.

Accordingly, a central portion of the shielding electrode 260 can protrude in the downstream direction 206 to position the shielding electrode 260 nearer to the sample 212 in the region proximate to the probe tips 216. As a more specific example, and as shown in FIG. 2, the shielding electrode 260 can include a shielding electrode central region 261 that includes and/or defines the shielding electrode aperture 262 and a shielding electrode peripheral region 263 radially exterior of the shielding electrode central region 261. The shielding electrode central region 261 can extend away from the shielding electrode peripheral region 263 along the downstream direction 206. In particular, in this example, the shielding electrode central region 261 extends along the downstream direction 206 such that the shielding electrode central region 261 is at least partially frusto-conical in shape. Additionally, in this example, the shielding electrode central region 261 extends beyond the lens body 252 in the downstream direction 206. In this manner, the shielding electrode central region 261 can extend closer to the sample 212 than the shielding electrode peripheral region 263, thereby reducing the focal working distance 218 relative to a configuration in which the shielding electrode 260 is flat and/or planar.

In various examples, the shielding electrode central region 261 may be angled relative to the shielding electrode peripheral region 263 by a similar degree as that by which each probe tip 216 is angled relative to the corresponding probe beam 215. As shown in FIG. 2, such a configuration can allow for the shielding electrode central region 261 to be spaced apart from the probe tips 216 by a substantially similar distance as that by which the shielding electrode peripheral region 263 is spaced apart from the probe beams 215.

The steering electrode 266 may be similar in shape and/or form to the shielding electrode 260. For example, and as shown in FIG. 2, the steering electrode 266 can include a steering electrode central region 267 that includes and/or defines the steering electrode aperture 268 and a steering electrode peripheral region 269 radially exterior of the steering electrode central region 267. The steering electrode central region 267 can extend away from the steering electrode peripheral region 269 along the downstream direction 206. In particular, in the example of FIG. 2, the steering electrode central region 267 extends along the downstream direction 206 such that the steering electrode central region 267 is at least partially frusto-conical in shape. In this example, the steering electrode central region 267 extends in the downstream direction 206 such that a portion of the steering electrode central region 267 is received within the shielding electrode central region 261.

The shielding electrode 260 and the steering electrode 266 can be supported by the objective lens 250 in any of a variety of manners. For example, and as shown in FIG. 2, the shielding electrode 260 may be directly coupled to and/or supported by the lens body 252. In particular, in this example, the shielding electrode 260 is coupled to the lens body 252 at the shielding electrode peripheral region 263. In some examples, the shielding electrode 260 may be electrically coupled to the lens body 252.

In the example of FIG. 2, the steering electrode 266 is coupled to the shielding electrode 260 via the steering electrode peripheral region 269. In particular, in this example, the objective lens 250 includes an electrode standoff 272 that couples the shielding electrode 260 and the steering electrode 266 to one another, such as by supporting the steering electrode 266 relative to the shielding electrode 260. In this example, the electrode standoff 272 is an annular structure that extends between the shielding electrode peripheral region 263 and the steering electrode peripheral region 269. In other examples, the electrode standoff 272 can include a plurality of spaced apart components circumferentially spaced around the lens central axis 251.

In this manner, in the example of FIG. 2, the steering electrode 266 may be described as being at least partially supported by the shielding electrode 260. This is not required of all examples, however, and it additionally is within the scope of the present disclosure that the steering electrode 266 can be supported by any other portion of the objective lens 250. For example, the steering electrode 266 may be at least partially and/or exclusively supported by the lens body 252.

The steering electrode 266 may be electrically isolated form the shielding electrode 260 and/or the lens body 252. In this manner, the steering electrode 266 may be maintained at a steering electrode voltage that is different from a voltage at which the shielding electrode 260 is maintained (e.g., electrical ground). In particular, in some examples, the electrode standoff 272 can include an electrically insulating material that electrically isolates the steering electrode 266 from the shielding electrode 260.

As discussed above, the use of the steering electrode 266 in combination with the shielding electrode 260 can allow for adjustment of the maximum attainable operative working distance (e.g., by controlling and/or adjusting the focal working distance 218) while limiting protrusion of the lens electrostatic field downstream of the shielding electrode 260. One or more dimensions of the shielding electrode 260 and/or of the steering electrode 266 can be selected and/or configured at least partially based on such functionality. For example, and as shown in FIG. 2, the shielding electrode aperture 262 may be characterized by a shielding electrode aperture diameter 264. In general, configuring the shielding electrode 260 with an increasingly small shielding electrode aperture diameter can more effectively limit protrusion of the lens electrostatic field downstream of the shielding electrode 260, but also may correspondingly increase a lensing effect that tends to limit the attainable operative working distance. Accordingly, the shielding electrode aperture diameter 264 may be selected and/or configured to balance the considerations of limiting protrusion of the lens electrostatic field while maintaining the attainable value of the focal working distance 218 at a sufficiently high value.

As shown in FIG. 2, the steering electrode aperture 268 similarly can be characterized by a steering electrode aperture diameter 270. In the example of FIG. 2, the steering electrode aperture diameter 270 is greater than the shielding electrode aperture diameter 264. In this manner, the shielding electrode 260 also can operate to shield the test region 211 from the electrostatic field generated by the steering electrode 266. By contrast, in an example in which the steering electrode aperture diameter 270 is equal to or less than the shielding electrode aperture diameter 264, a portion of the electrostatic field generated by the steering electrode 266 can undesirably protrude into the test region 211. The configuration shown in FIG. 2 is not required of all examples, however, and it additionally is within the scope of the present disclosure that the steering electrode aperture diameter 270 can be equal to, or less than, the shielding electrode aperture diameter 264.

Figure 3:
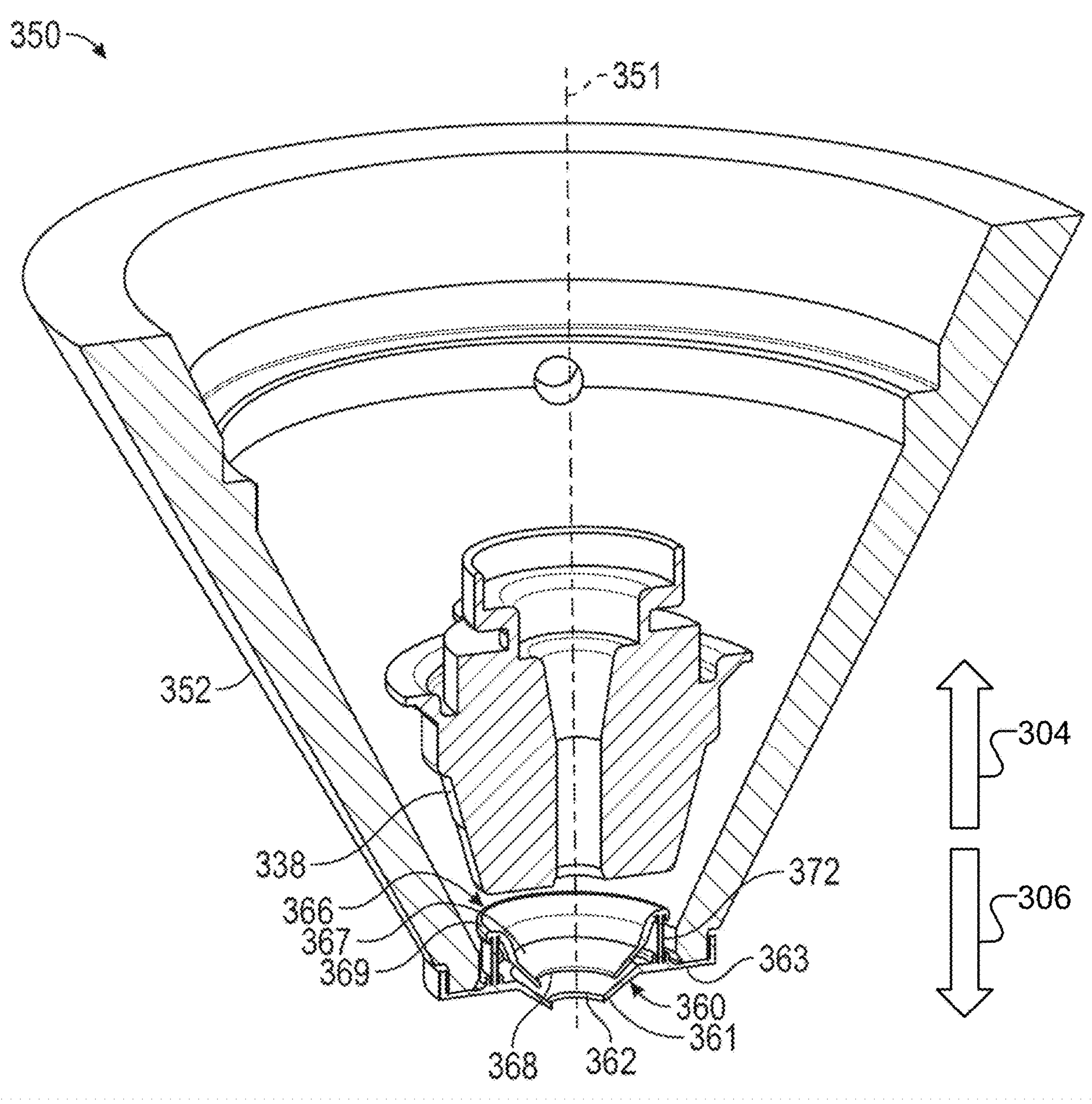
FIG. 3 is a cross-sectional perspective view of an objective lens according to an example.

FIG. 3 is a cross-sectional view of another example of an objective lens 350. The objective lens 350 may be described as an example of the objective lens 150 of FIG. 1 and/or as a component of the CPM system 100 of FIG. 1. Accordingly, like reference numerals are used to label like components in FIGS. 3 and FIGS. 1-2. Specifically, unless otherwise stated, all illustrated components of FIG. 3, labeled or unlabeled, can share any suitable features, characteristics, attributes, etc. with the corresponding components of either of FIGS. 1-2. For those components labeled in FIG. 3, components labeled with a reference numeral of the form "3XX" are intended to correspond with the components labeled with a reference numeral of the form "1XX" in FIG. 1 and/or with the components labeled with a reference numeral of the form "2XX" in FIG. 2.

Similar to the objective lens 250 of FIG. 2, the objective lens 350 of FIG. 3 includes a shielding electrode 360 coupled to the lens body 352 with a shielding electrode central region 361 that extends away from the lens body 352 along the downstream direction 306. The objective lens 350 additionally includes a steering electrode 366 that is supported relative to the shielding electrode 360 by an annular electrode standoff 372. A downstream end portion of the booster tube 338 is represented in FIG. 3; it is to be understood, however, that the booster tube 338 can extend in the upstream direction 304 out of the objective lens 350.

FIGS. 4A-4D represent the effects of the shielding electrode and the steering electrode on the focusing properties of an objective lens according to the present disclosure. In particular, FIGS. 4A-4D represent modeled beam profiles of charged particle beams **422*a*-422*d* at a focus location downstream of an objective lens (e.g., the objective lens 150 of FIG. 1, the objective lens 250 of FIG. 2, or the objective lens 350 of FIG. 3) in the presence of a plurality of sample probes (e.g., the sample probes 114 of FIG. 1 or the sample probes 214 of FIG. 2). The focus location represented in each of FIGS. 4A-4D can represent and/or correspond to the focus location 124 of FIG. 1 and/or the focus location 224 of FIG. 2. In this manner, FIGS. 4A-4D may be described as representing properties of the charged particle beam 122 of the CPM system 100 of FIG. 1 in various operational conditions. Each of FIGS. 4A-4D corresponds to an example in which the booster tube voltage applied to the booster tube (e.g., the booster tube 138 of FIG. 1, the booster tube 238 of FIG. 2, or the booster tube 338 of FIG. 3**) is 8000 V.

Figure 4A:
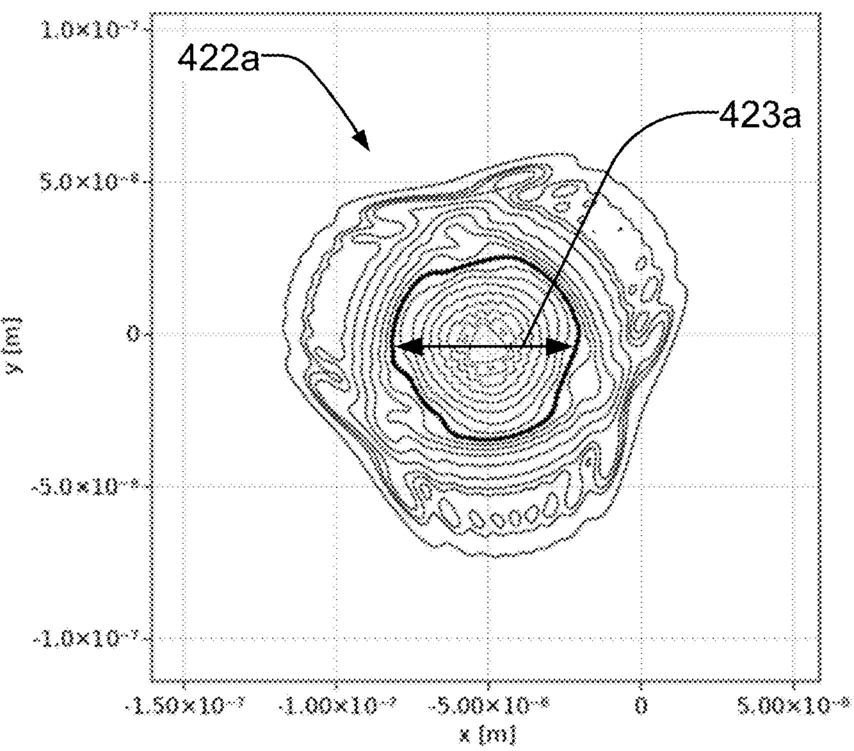
FIG. 4A is an illustration of a simulation of a charged particle beam profile at a sample test location with a landing energy of 200 eV and without the use of a steering electrode, according to an example.
Figure 4B:
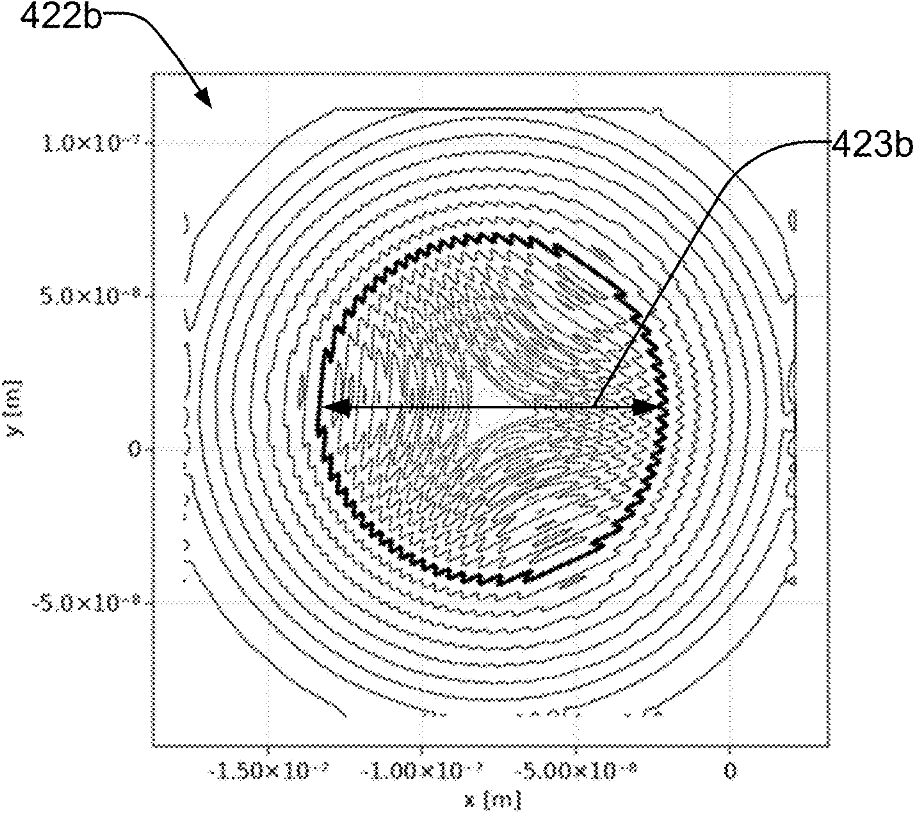
FIG. 4B is an illustration of a simulation of a charged particle beam profile at a sample test location with a landing energy of 80 eV and without the use of a steering electrode, according to an example.
Figure 4C:
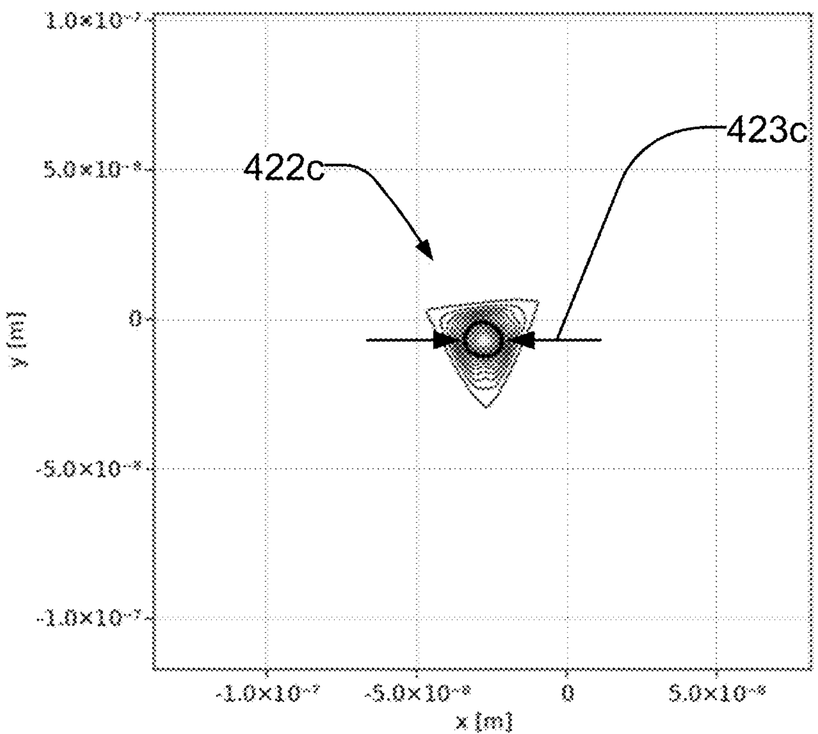
FIG. 4C is an illustration of a simulation of a charged particle beam profile at a sample test location with a landing energy of 200 eV and with the use of a steering electrode, according to an example.
Figure 4D:
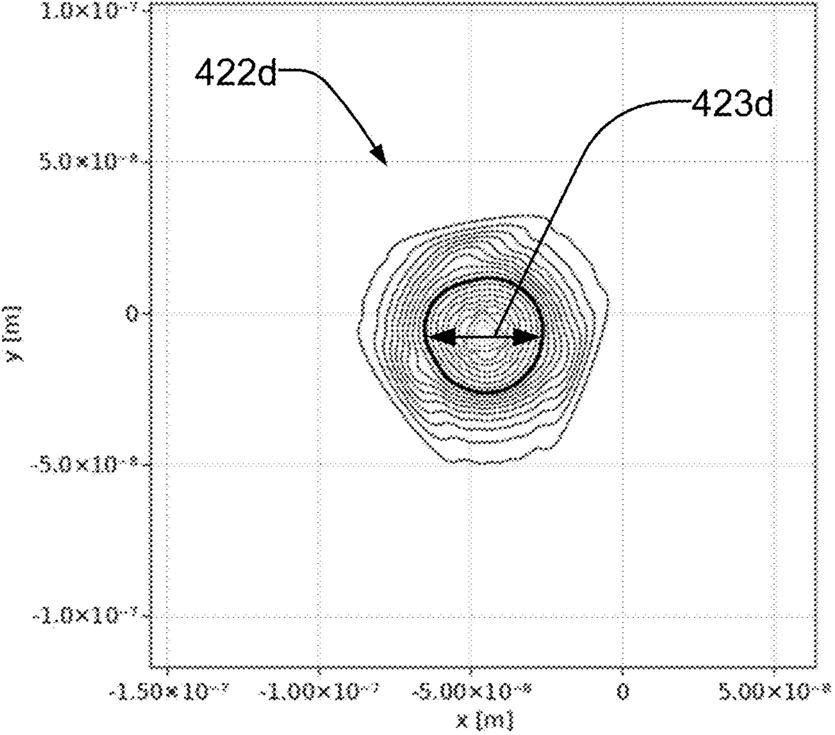
FIG. 4D is an illustration of a simulation of a charged particle beam profile at a sample test location with a landing energy of 80 eV and with the use of a steering electrode, according to an example.

FIGS. 4A-4B represent modeled beam profiles without the use of the steering electrode, while FIGS. 4C-4D represent modeled beam profiles with the steering electrode voltage applied to the steering electrode. Additionally, FIGS. 4A and 4C represent configurations in which the charged particle beams **422*a*/422*c* are incident upon the focus plane with a landing energy of 200 eV, while FIGS. 4B and 4D represent configurations in which the charged particle beams 422*b*/422*d*** are incident upon the focus plane with a landing energy of 80 eV.

As a representative measure of the focusing properties of objective lens configuration corresponding to each of FIGS. 4A-4D, FIGS. 4A-4D additionally illustrate characteristic beam diameters **423*a*-423*d* associated with the modeled charged particle beams 422*a*-422*d*. In particular, each characteristic beam diameter 423*a*-423*d* corresponds to the diameter of a circle or ring oriented perpendicular to the lens central axis and/or to the optical axis that contains 50% of the charged particles of the charged particle beam 422*a*-422*b*** at the focus location.

In the example of FIG. 4A, the characteristic beam diameter **423*a* corresponding to a landing energy of 200 eV is 61 nm, while in the example of FIG. 4B, the characteristic beam diameter 423*b* corresponding to a landing energy of 80 eV is 114 nm. Thus, comparing FIGS. 4A-4B, it can be seen that, in the absence of the steering electrode voltage, reducing the landing energy from 200 eV to 80 eV (e.g., by reducing the energy of the electrons emitted by the electron emitter, such as the charged particle source 120 of FIG. 1.) corresponds with an increase in the characteristic beam diameter 423*b*. Such an increase in the characteristic beam diameter 423*b* can result from the increased protrusion in the lens electrostatic field into the test region due to the increased booster tube voltage. This increase in the characteristic beam diameter 423*b*** may produce a correspondingly diminished image quality of the image of the sample produced by the associated CPM system.

By contrast, in the example of FIG. 4C, the characteristic beam diameter **423*b* corresponding to a landing energy of 200 eV with the steering voltage applied to the steering electrode is 12 nm, while in the example of FIG. 4D, the characteristic beam diameter 423*d* corresponding to a landing energy of 80 eV with the steering voltage applied to the steering electrode is 38 nm. In particular, the examples of FIGS. 4C-4D may be described as corresponding to a steering voltage in the range 1000 V-2000 V. Comparing FIGS. 4A and 4C, and comparing FIGS. 4B and 4D, it can be seen that, for a given value of the landing energy, applying the steering electrode voltage to the steering electrode yields a significantly smaller characteristic beam diameter, which in turn can yield a clearer image of the sample when the charged particle beam 422*c*/422*d* is used to image the sample. In particular, the modeling results of FIG. 4D demonstrate that the use of the steering electrode can enable focusing the charged particle beam 422*d* with an acceptably small characteristic beam diameter 423*d*** as well as with a desirably low landing energy that otherwise is associated with an undesirably large characteristic beam diameter.

FIGS. 5A-5F represent additional examples of modeled parameters associated with objective lenses according to the present disclosure. Similar to FIGS. 4A-4D, each of FIGS. 5A-5F may be described as representing properties of a charged particle beam associated with (e.g., generated and/or focused by) the CPM system and/or the objective lens of any of FIGS. 1-3.

Each of FIGS. 5A-5F represents the characteristic beam diameters 523*a*-523*f* (in nm) associated with a charged particle beam focused by an objective lens according to the present disclosure. Specifically, each of FIGS. 5A-5F represents a relationship between the landing energy (LE) of a charged particle beam at the focus location and the characteristic beam diameter associated with each landing energy in a given operational configuration of the CPM system. In this manner, FIGS. 5A-5F demonstrate the tradeoff between the protruding electrostatic field at the sample location (represented as an axial electrical field strength $E_z$) and the achievable minimum landing energy, together with the attainable characteristic beam diameter. For example, each of FIGS. 5A-5F can represent the manner in which the characteristic beam diameters 523*a*-523*f* vary as the landing energy is varied at a constant value of the booster tube voltage and at a constant focal working distance. Specifically, in each of FIGS. 5A-5F, the characteristic beam diameters 523*a*-523*f* correspond to a charged particle beam at a focus location characterized by a focal working distance of 2.5 mm. In each of FIGS. 5A-5F, the variation in the landing energy can be achieved via corresponding variation in the energy of the electrons emitted by the electron emitter (e.g., the charged particle source 120 of FIG. 1).

Additionally represented in each of FIGS. 5A-5F is an axial electric field strength $E_z$ of the lens electrostatic field associated with the operational configuration represented in the figure. In these examples, the axial electric field strength represents a magnitude of the lens electrostatic field as measured at the focus location and in a direction parallel to the optical axis. In this manner, the axial electric field strength may be understood as representing a measure of an extent to which the lens electrostatic field protrudes into the test region and/or to the focus location.

Figure 5A:
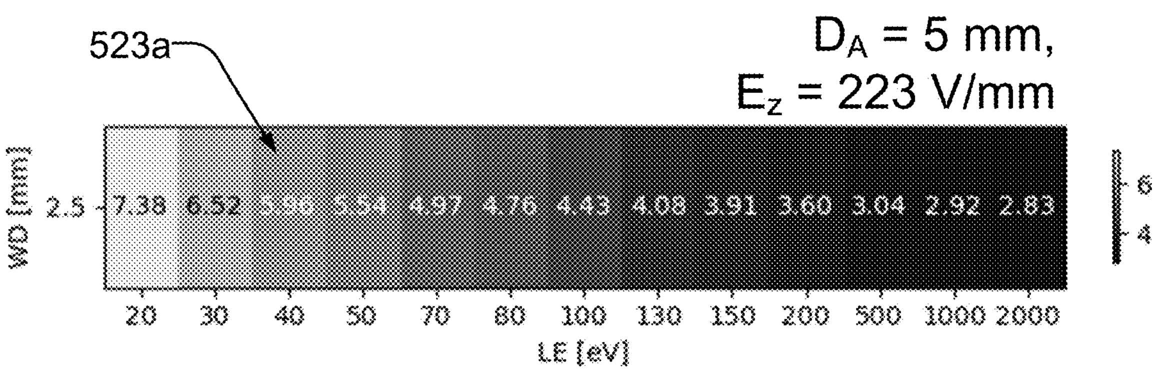
FIG. 5A is an illustration of relationship between a characteristic beam diameter of a charged particle beam and a landing energy of the charged particle beam in a configuration in which an objective lens produces an axial electrostatic field strength at a sample test location that is 223 V/mm and without the use of a steering electrode, according to an example.
Figure 5B:
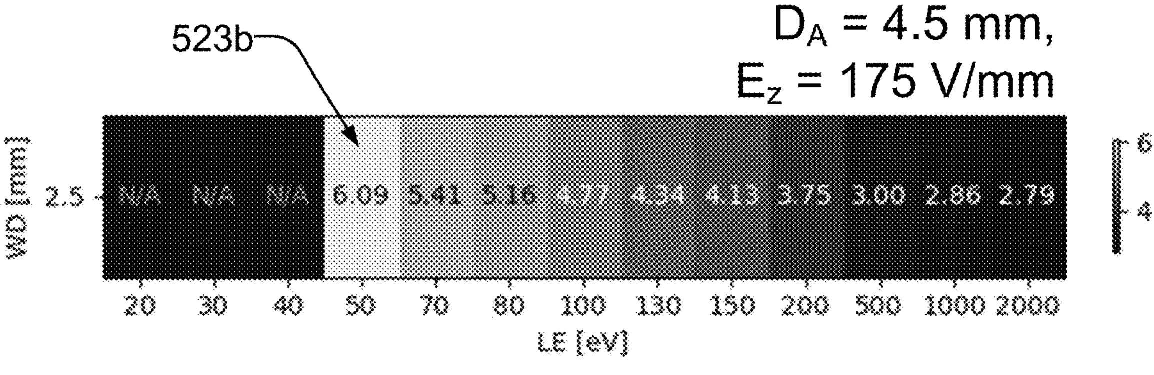
FIG. 5B is an illustration of relationship between a characteristic beam diameter of a charged particle beam and a landing energy of the charged particle beam in a configuration in which an objective lens produces an axial electrostatic field strength at a sample test location that is 175 V/mm and without the use of a steering electrode, according to an example.
Figure 5C:
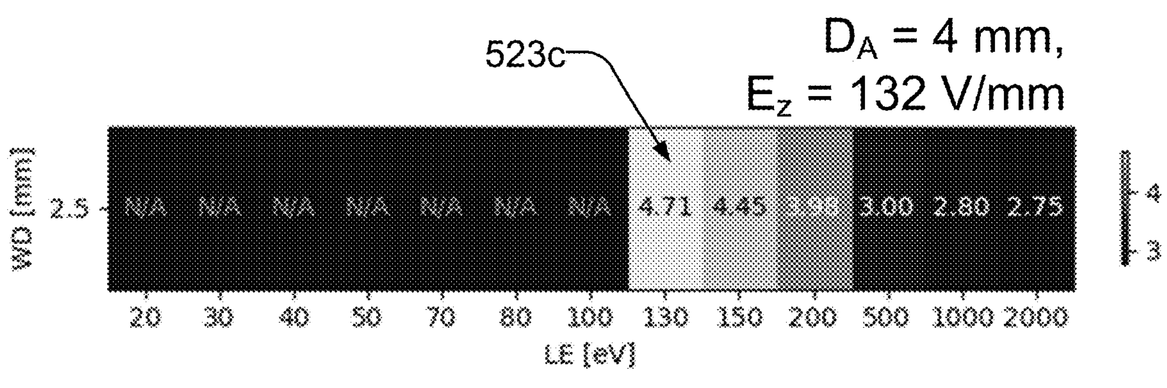
FIG. 5C is an illustration of relationship between a characteristic beam diameter of a charged particle beam and a landing energy of the charged particle beam in a configuration in which an objective lens produces an axial electrostatic field strength at a sample test location that is 132 V/mm and without the use of a steering electrode, according to an example.
Figure 5D:
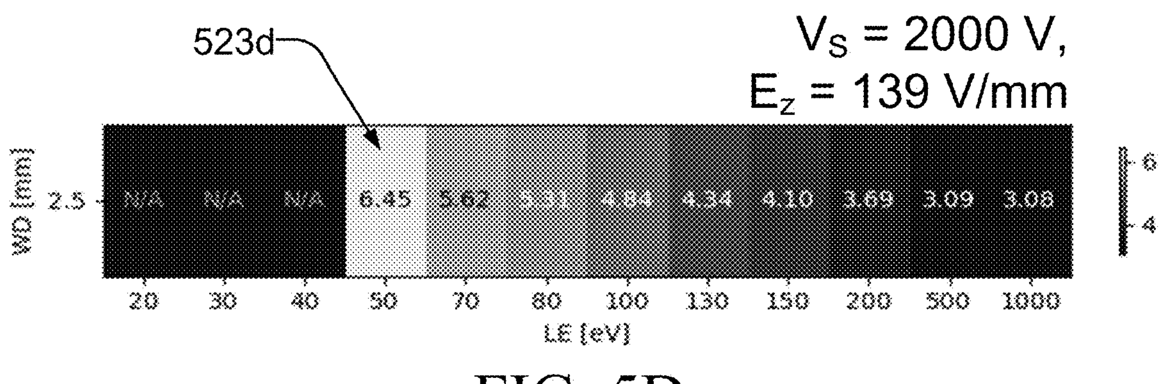
FIG. 5D is an illustration of relationship between a characteristic beam diameter of a charged particle beam and a landing energy of the charged particle beam in a configuration in which an objective lens produces an axial electrostatic field strength at a sample test location that is 139 V/mm and with the use of a steering electrode, according to an example.
Figure 5E:
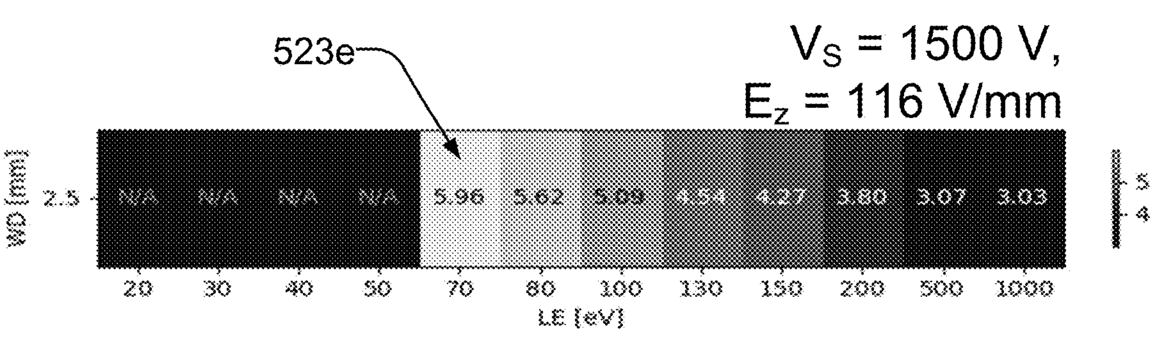
FIG. 5E is an illustration of relationship between a characteristic beam diameter of a charged particle beam and a landing energy of the charged particle beam in a configuration in which an objective lens produces an axial electrostatic field strength at a sample test location that is 116 V/mm and with the use of a steering electrode, according to an example.
Figure 5F:
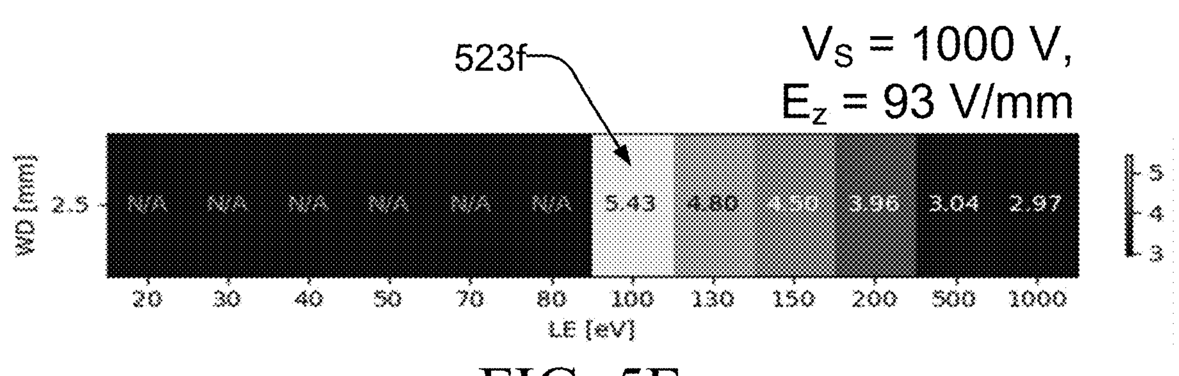
FIG. 5F is an illustration of relationship between a characteristic beam diameter of a charged particle beam and a landing energy of the charged particle beam in a configuration in which an objective lens produces an axial electrostatic field strength at a sample test location that is 93 V/mm and with the use of a steering electrode, according to an example.

Each of FIGS. 5A-5C corresponds to a configuration without the use of a steering electrode, while each of FIGS. 5D-5F corresponds to a configuration in which a steering electrode voltage is applied to a steering electrode.

Each of FIGS. 5A-5C may be described as representing a dependence of the characteristic beam diameter 523*a*-523*c* on the landing energy and/or beam current at a common booster tube voltage and at different respective aperture diameters $D_A$. For example, each of FIGS. 5A-5C can represent a respective value of the shielding electrode aperture diameter 264 of FIG. 2 (without the use and/or presence of the steering electrode 266), with FIG. 5A representing a shielding electrode aperture diameter of $D_A$=5 mm, FIG. 5B representing a shielding electrode aperture dimeter of $D_A$=4.5 mm, and FIG. 5C representing a shielding electrode aperture diameter of $D_A$–4 mm.

Comparing FIGS. 5A-5C, it can be seen that reducing the shielding electrode aperture diameter (e.g., from 5 mm to 4 mm) has the effect of desirably reducing the axial electric field strength at the focus location. Such reduction in the shielding electrode aperture, however, also undesirably yields an increase in the characteristic beam diameter 523*a*-523*f* associated with a given landing energy value. While it may be possible to adjust the shielding electrode aperture diameter and/or beam current to balance the axial electric field strength and characteristic beam diameter, it may not be possible to achieve both a desirably small axial electric field strength and a desirably small characteristic beam diameter at a desirably small value of the landing energy. For example, comparing FIGS. 5A-5C, it can be seen that no combination of these operational parameters yields a characteristic beam diameter of less than about 5 nm with a landing energy of less than 100 eV and an axial electric field strength of less than 175 eV, as would be desirable for high-resolution imaging during EFA.

By contrast, FIGS. 5D-5F represent the correspondence between characteristic beam diameters 523*d*-523*f* at a common booster tube voltage and at a common value of the shielding electrode voltage diameter, but with different respective values of the steering electrode voltage applied to the steering electrode. Specifically, FIG. 5D represents a configuration in which the steering electrode voltage is 2000 V, FIG. 5E represents a configuration in which the steering electrode voltage is 1500 V, and FIG. 5F represents a configuration in which the steering electrode voltage is 1000 V. Each of FIGS. 5D-5F represents a configuration in which the booster tube voltage is 8000 V.

Similar to the effect of reducing the shielding electrode aperture diameter in FIGS. 5A-5C, it can be seen in FIGS. 5D-5F that reducing the steering electrode voltage (e.g., from 2000 V to 1000 V) has the effect of desirably reducing the axial electric field strength at the focus location. While such reduction in the steering electrode voltage yields an increase in the characteristic beam diameter 523*d*-523*f* associated with a given landing energy value, the use of the steering electrode enables the system to achieve desirable combinations of these parameters.

For example, unlike the examples of FIGS. 5A-5C, it can be seen (e.g., in FIG. 5E) that a landing energy of less than 100 eV can be achieved with a characteristic beam diameter 523*e* of less than 6 nm and with an axial electric field strength at the focus location that is significantly smaller than in the examples of FIGS. 5A-5C. Additionally, comparing FIG. 5E with FIG. 5D, it can be seen that a lower landing energy can be achieved at a given characteristic beam diameter (or a smaller characteristic beam diameter at a given landing energy) by increasing the steering electrode voltage, at the expense of an increased axial electric field strength. Alternatively, comparing FIG. 5E with FIG. 5F, it can be seen that a smaller axial electric field strength can be achieved by lowering the steering electrode voltage, at the expense of an increased characteristic beam diameter at a given landing energy (or an increased landing energy at a given characteristic beam diameter).

In practice, a preferred balance between axial electric field strength, characteristic beam diameter, and landing energy can be achieved via appropriate variation of the steering electrode voltage, together with suitable selections of booster tube voltage, beam current, and shielding electrode aperture diameter. Comparing FIGS. 5D-5F with FIGS. 5A-5C, it is seen that variation of the steering electrode voltage enables favorable combinations of such parameters to be achieved, even at a constant value of the shielding electrode aperture diameter.

Each of the operational parameters discussed herein may be variable through any suitable range of values. In practice, the specific value of any of the operational parameters discussed herein can be selected and/or tuned (e.g., to a value within any of the ranges disclosed herein) based upon the needs and/or constraints of a given operational configuration.

As examples, the booster tube voltage applied to any booster tube disclosed herein (e.g., the booster tube 138 of FIG. 1, the booster tube 238 of FIG. 2, or the booster tube 238 of FIG. 3) may be at least 5 kilovolts (kV), at least 7 kV, at least 10 kV, at most 12 kV, at most 8 kV, at most 6 kV, 5-8 kV, 7-12 kV, and/or 5-12 kV.

Additionally or alternatively, the steering electrode voltage applied to any steering electrode disclosed herein (e.g., the steering electrode 166 of FIG. 1, the steering electrode 266 of FIG. 2, or the steering electrode 366 of FIG. 3) may be at least 500 V, at least 1000 V, at least 1500 V, at least 2000 V, at most 2500 V, at most 1700 V, at most 1200 V, at most 700 V, 500-1200 V, 1000-1700 V, 1500-2500 V, 500-1700 V, 1000-2500 V, and/or 500-2500 V.

Additionally or alternatively, any objective lens disclosed herein (e.g., the objective lens 150 of FIG. 1, the objective lens 250 of FIG. 2, or the objective lens 350 of FIG. 3) may be configured to operate with a focal working distance (e.g., the focal working distance 218 of FIG. 2) that is on the order of small units of millimeters. As more specific examples, the focal working distance can be at least 1 millimeter (mm), at least 2 mm, at least 5 mm, at least 10 mm, at most 15 mm, at most 7 mm, at most 3 mm, at most 1.5 mm, 1-3 mm, 2-7 mm, 5-15 mm, 1-7 mm, 3-15 mm, and/or 1-15 mm.

Additionally or alternatively, any objective lens disclosed herein (e.g., the objective lens 150 of FIG. 1, the objective lens 250 of FIG. 2, or the objective lens 350 of FIG. 3) may be configured to operate such that the landing energy of a charged particle beam (e.g., the charged particle beam 122 of FIG. 1) at a focus location associated with the objective lens (e.g., the focus location 224 of FIG. 2) is at least 5 eV, at least 10 eV, at least 20 eV, at least 30 eV, at 50 eV, at least 70 eV, at least 90 eV, at least 120 eV, at most 200 eV, at most 150 eV, at most 100 eV, at most 80 eV, at most 60 eV, at most 40 eV, at most 25 eV, at most 15 eV, at most 7 eV, 5-15 eV, 10-25 eV, 20-40 eV, 30-60 eV, 50-80 eV, 70-100 eV, 90-150 eV, 120-200 eV, 5-25 eV, 10-40 eV, 20-60 eV, 30-80 eV, 50-100 eV, 70-150 eV, 90-200 eV, 5-40 eV, 10-60 eV, 20-80 eV, 30-100 eV, 50-150 eV, 70-200 eV, 5-60 eV, 10-80 eV, 20-100 eV, 30-150 eV, 50-200 eV, 5-80 eV, 10-100 eV, 20-150 eV, 30-200 eV, 5-100 eV, 10-150 eV, 20-200 eV, 5-150 eV, 10-200 eV, and/or 5-200 eV.

Additionally or alternatively, any objective lens disclosed herein (e.g., the objective lens 150 of FIG. 1, the objective lens 250 of FIG. 2, or the objective lens 350 of FIG. 3) may be configured to operate such that the axial electric field strength of the lens electrostatic field produced by the objective lens is at least 70 volts per millimeter (V/mm), at least 90 V/mm, at least 120 V/mm, at least 140 V/mm, at least 160 V/mm, at most 175 V/mm, at most 150 V/mm, at most 130 V/mm, at most 100 V/mm, at most 80 V/mm, 70-100 V/mm, 90-130 V/mm, 120-150 V/mm, 140-175 V/mm, 70-130 V/mm, 90-150 V/mm, 120-175 V/mm, 70-150 V/mm, 90-175 V/mm, and/or 70-175 V/mm.

Additionally or alternatively, any objective lens disclosed herein (e.g., the objective lens 150 of FIG. 1, the objective lens 250 of FIG. 2, or the objective lens 350 of FIG. 3) may be configured to operate such that the characteristic beam diameter of a charged particle beam (e.g., the charged particle beam 122 of FIG. 1) at a focus location associated with the objective lens (e.g., the focus location 224 of FIG. 2) is at least 1 nm, at least 3 nm, at least 5 nm, at least 10 nm, at least 15 nm, at least 20 nm, at least 30 nm, at most 40 nm, at most 25 nm, at most 17 nm, at most 12 nm, at most 7 nm, at most 2 nm, 1-7 nm, 3-12 nm, 5-17 nm, 10-25 nm, 15-40 nm, 1-12 nm, 3-17 nm, 5-25 nm, 10-40 nm, 1-17 nm, 3-25 nm, 5-40 nm, 1-25 nm, 3-40 nm, and/or 1-40 nm.

Figure 6:
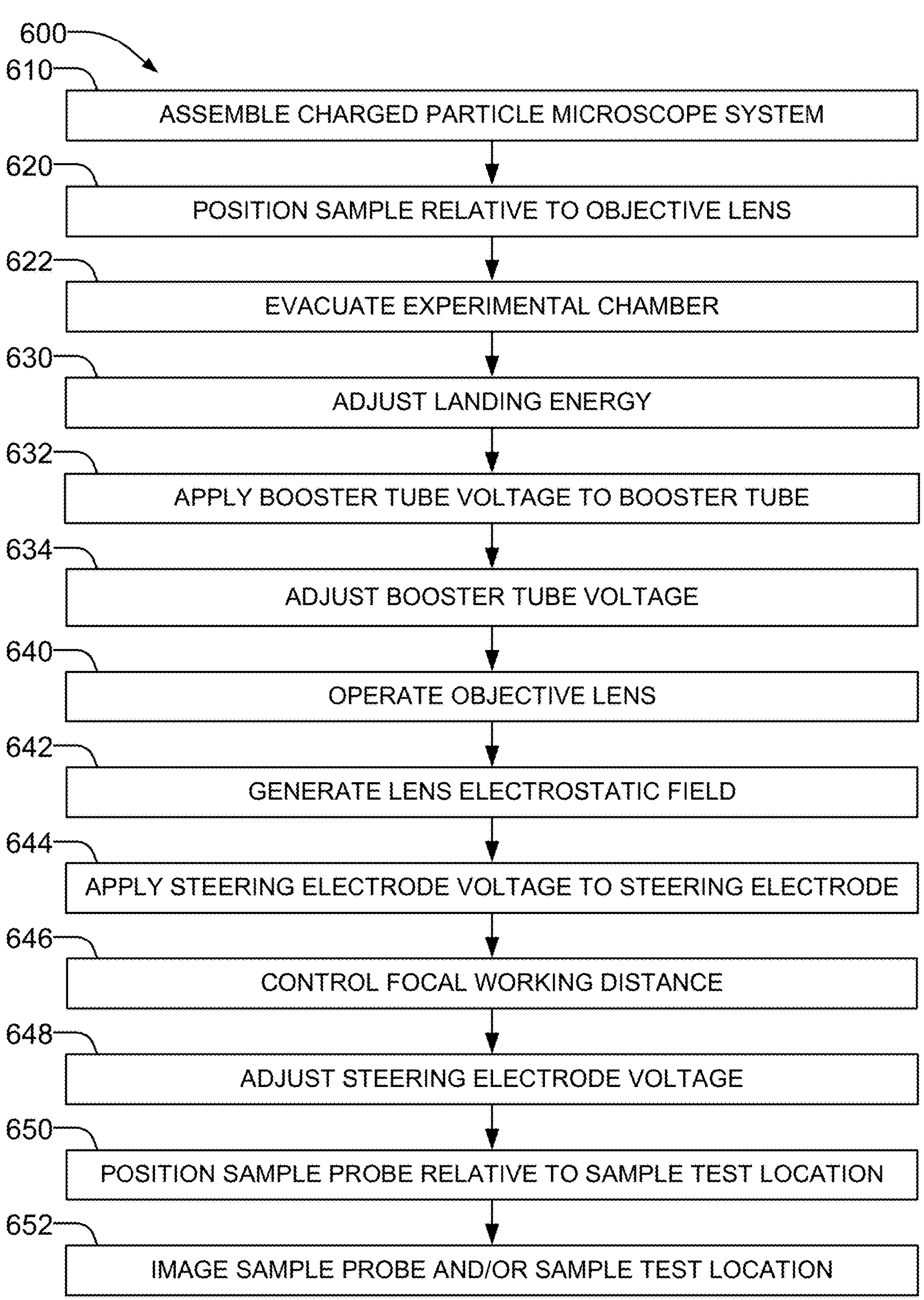
FIG. 6 is a flow chart depicting methods of assembling and/or operating a CPM system including an objective lens according to an example.

FIG. 6 is a flow chart depicting examples of a method 600 of operating a objective lens (e.g., the objective lens 150 of FIG. 1, the objective lens 250 of FIG. 2, and/or the objective lens 350 of FIG. 3) and/or a CPM system including such an objective lens (e.g., the CPM system 100 of FIG. 1). In the following discussion, various components are described in the context of the method 600 with terms that correspond to components illustrated in FIGS. 1-3 and discussed above. Such components described herein with reference to the method 600 thus may be understood as corresponding to and/or as representing the similarly named components described above with reference to FIGS. 1-3. As described in more detail below, any suitable portions of the method 600 can be performed with a controller of the CPM system, such as the controller 180 of FIG. 1.

As shown in FIG. 6, the method 600 includes positioning, at 620, a sample relative to the objective lens and operating, at 640, the objective lens, such as to focus a charged particle beam to a focus location. The positioning the sample at 620 can include positioning such that at least a portion of the sample is positioned at (e.g., within and/or adjacent to) the focus location.

The positioning the sample at 620 can include positioning the sample at any of a variety of focal and/or sample working distances, as measured between the objective lens and the sample and/or between the objective lens and the focus location. As examples, the positioning the sample at 620 can include positioning such that the focal working distance and/or the sample working distance is at least 1 mm, at least 2 mm, at least 5 mm, at least 10 mm, at most 15 mm, at most 7 mm, at most 3 mm, at most 1.5 mm, 1-3 mm, 2-7 mm, 5-15 mm, 1-7 mm, 3-15 mm, and/or 1-15 mm.

The method 600 can include operating the CPM system to direct a charged particle beam to the focus location and/or to the sample with any of a variety of beam properties. As examples, the operating the objective lens at 640 can include operating such that a landing energy of the charged particle beam, as measured at the focus location, is at least 5 eV, at least 10 eV, at least 20 eV, at least 30 eV, at 50 eV, at least 70 eV, at least 90 eV, at least 120 eV, at most 200 eV, at most 150 eV, at most 100 eV, at most 80 eV, at most 60 eV, at most 40 eV, at most 25 eV, at most 15 eV, at most 7 eV, 5-15 eV, 10-25 eV, 20-40 eV, 30-60 eV, 50-80 eV, 70-100 eV, 90-150 eV, 120-200 eV, 5-25 eV, 10-40 eV, 20-60 eV, 30-80 eV, 50-100 eV, 70-150 eV, 90-200 eV, 5-40 eV, 10-60 eV, 20-80 eV, 30-100 eV, 50-150 eV, 70-200 eV, 5-60 eV, 10-80 eV, 20-100 eV, 30-150 eV, 50-200 eV, 5-80 eV, 10-100 eV, 20-150 eV, 30-200 eV, 5-100 eV, 10-150 eV, 20-200 eV, 5-150 eV, 10-200 eV, and/or 5-200 eV.

Additionally or alternatively, the method 600 can include operating the CPM system such that a characteristic beam diameter of the charged particle beam at the focus location is at least 1 nm, at least 3 nm, at least 5 nm, at least 10 nm, at least 15 nm, at least 20 nm, at least 30 nm, at most 40 nm, at most 25 nm, at most 17 nm, at most 12 nm, at most 7 nm, at most 2 nm, 1-7 nm, 3-12 nm, 5-17 nm, 10-25 nm, 15-40 nm, 1-12 nm, 3-17 nm, 5-25 nm, 10-40 nm, 1-17 nm, 3-25 nm, 5-40 nm, 1-25 nm, 3-40 nm, and/or 1-40 nm.

Additionally or alternatively, the operating the objective lens at 640 can include operating such that the lens electrostatic field generated by the objective lens has an axial electric field strength that is at least 70 V/mm, at least 90 V/mm, at least 120 V/mm, at least 140 V/mm, at least 160 V/mm, at most 175 V/mm, at most 150 V/mm, at most 130 V/mm, at most 100 V/mm, at most 80 V/mm, 70-100 V/mm, 90-130 V/mm, 120-150 V/mm, 140-175 V/mm, 70-130

V/mm, 90-150 V/mm, 120-175 V/mm, 70-150 V/mm, 90-175 V/mm, and/or 70-175 V/mm.

As shown in FIG. 6, the operating the objective lens at 640 can include generating, at 642, the lens electrostatic field. The generating the lens electrostatic field at 642 can be performed in any suitable manner. For example, the generating the lens electrostatic field at 642 can include applying, at 644, a steering electrode voltage to a steering electrode. As more specific examples, the applying the steering electrode voltage at 644 can include applying a steering electrode voltage that is at least 500 V, at least 1000 V, at least 1500 V, at least 2000 V, at most 2500 V, at most 1700 V, at most 1200 V, at most 700 V, 500-1200 V, 1000-1700 V, 1500-2500 V, 500-1700 V, 1000-2500 V, and/or 500-2500 V.

In some examples, the applying the steering electrode voltage at 644 is at least partially performed with a controller of the CPM system, such as the controller 180 of FIG. 1. For example, the applying the steering electrode voltage at 644 can include supplying the steering electrode voltage to the steering electrode with a first voltage source of the controller.

In some examples, the applying the steering electrode voltage at 644 includes adjusting, at 648, the steering electrode voltage, such as with the controller. For example, the adjusting the steering electrode voltage at 648 can include selectively and/or dynamically regulating and/or varying the steering electrode voltage with the controller. In this manner, the applying the steering electrode voltage at 644 and/or the adjusting the steering electrode voltage at 648 can include bringing the steering electrode voltage to a target voltage, changing the steering electrode voltage to a different target voltage, regulating the steering electrode voltage to remain at the target voltage, etc.

In some examples, and as shown in FIG. 6, the method 600 can include applying, at 632, the booster tube voltage to the booster tube. As examples, the applying the booster tube voltage at 632 can include applying a booster tube voltage that is at least 5 kV, at least 7 kV, at least 10 kV, at most 12 kV, at most 8 kV, at most 6 kV, 5-8 kV, 7-12 kV, and/or 5-12 kV.

In various examples, and as described herein, the booster tube generates at least a portion of the lens electrostatic field. Accordingly, in some examples, the generating the lens electrostatic field at 642 may be described as including the applying the booster tube voltage to the booster tube at 632.

In some examples, the applying the booster tube voltage at 632 is at least partially performed with a controller of the CPM system, such as the controller 180 of FIG. 1. For example, the applying the booster tube voltage at 632 can include supplying the booster tube voltage to the booster tube with a second voltage source of the controller.

In some examples, the applying the booster tube voltage at 632 includes adjusting, at 634, the booster tube voltage, such as with the controller. For example, the adjusting the booster tube voltage at 634 can include selectively and/or dynamically regulating and/or varying the booster tube voltage with the controller.

In some examples, and as shown in FIG. 6, the operating the objective lens at 640 can include controlling, at 646, a focal working distance between the objective lens and the focus location. In particular, the controlling the focal working distance at 646 can include controlling and/or adjusting one or more operational parameters of the objective lens to regulate and/or vary (e.g., increase) a focal working distance of the objective lens. For example, and as described above, the focal working distance of the objective lens may be related to a focal length that is measured relative to a main objective plane of the objective lens, which in turn may be adjusted via adjustment of the steering electrode voltage. Accordingly, in some examples, the controlling the focal working distance at 646 can include, and/or can be a result of, the applying the steering electrode voltage at 644 and/or the adjusting the steering electrode voltage at 648. As more specific examples, the controlling the focal working distance at 646 can include the applying the steering electrode voltage at 644 to bring the steering electrode to a target voltage, can include the adjusting the steering electrode voltage at 648 to change the steering electrode voltage to a different voltage, can include maintaining the steering electrode voltage at a target voltage (e.g., via a feedback circuit), etc.

In various examples, the operating the objective lens at 640 includes focusing the charged particle beam to the focus location. As described herein, such focusing can include focusing with any suitable combination of electrostatic and/or magnetic fields, such as may include the lens electrostatic field described herein. As discussed, this lens electrostatic field can include contributions from and/or be modified by the booster tube, the steering electrode, and/or the shielding electrode. Accordingly, in some cases, the applying the booster tube voltage at 632 and/or the applying the steering electrode voltage at 644 may be described as contributing to the focusing of the charged particle beam to the focus location. It is to be understood, however, that in many examples, such focusing is primarily performed by adjusting electrostatic and/or magnetic fields other than via control of the booster tube voltage and/or the steering electrode voltage.

In some examples, and as shown in FIG. 6, the method 600 can include adjusting, at 630, a landing energy of the charged particle beam at the focus location. For example, and as described above, the landing energy of the charged particle beam can be at least partially based upon a source energy of the charged particle source that emits the charged particle beam. Accordingly, in some examples, the adjusting the landing energy at 630 can include adjusting the source energy of the charged particle source.

In some examples, and as shown in FIG. 6, the method 600 can include assembling, at 610, a CPM system that includes the objective lens. For example, the assembling the CPM system at 610 can include positioning the objective lens such that an optical axis of the CPM system extends through each of the shielding electrode and the steering electrode.

In some examples, and as shown in FIG. 6, the method 600 can include evacuating, at 622, an experimental chamber that encloses the sample, the objective lens, and/or at least a portion of the CPM system. In some examples, the evacuating the experimental chamber at 622 can be performed prior to the operating the objective lens at 640. In this manner, the operating the objective lens at 640 (and/or any other suitable portions of the method 600) can be performed while the sample remains under vacuum.

In some examples, and as shown in FIG. 6, the method 600 can include positioning, at 650, a sample probe relative to a sample test location of the sample and/or imaging, at 652, the sample probe and/or the sample test location with a CPM system that includes an objective lens according to the present disclosure. In particular, the positioning the sample probe at 650 can include, and/or can be performed in combination with, the imaging at 652. The positioning the sample probe at 650 can be performed in any suitable manner, such as by moving the sample probe relative to the sample (e.g., with a probe manipulator) and/or by moving the sample relative to the sample probe (e.g., with a sample holder and/or motion stage).

Figure 7:
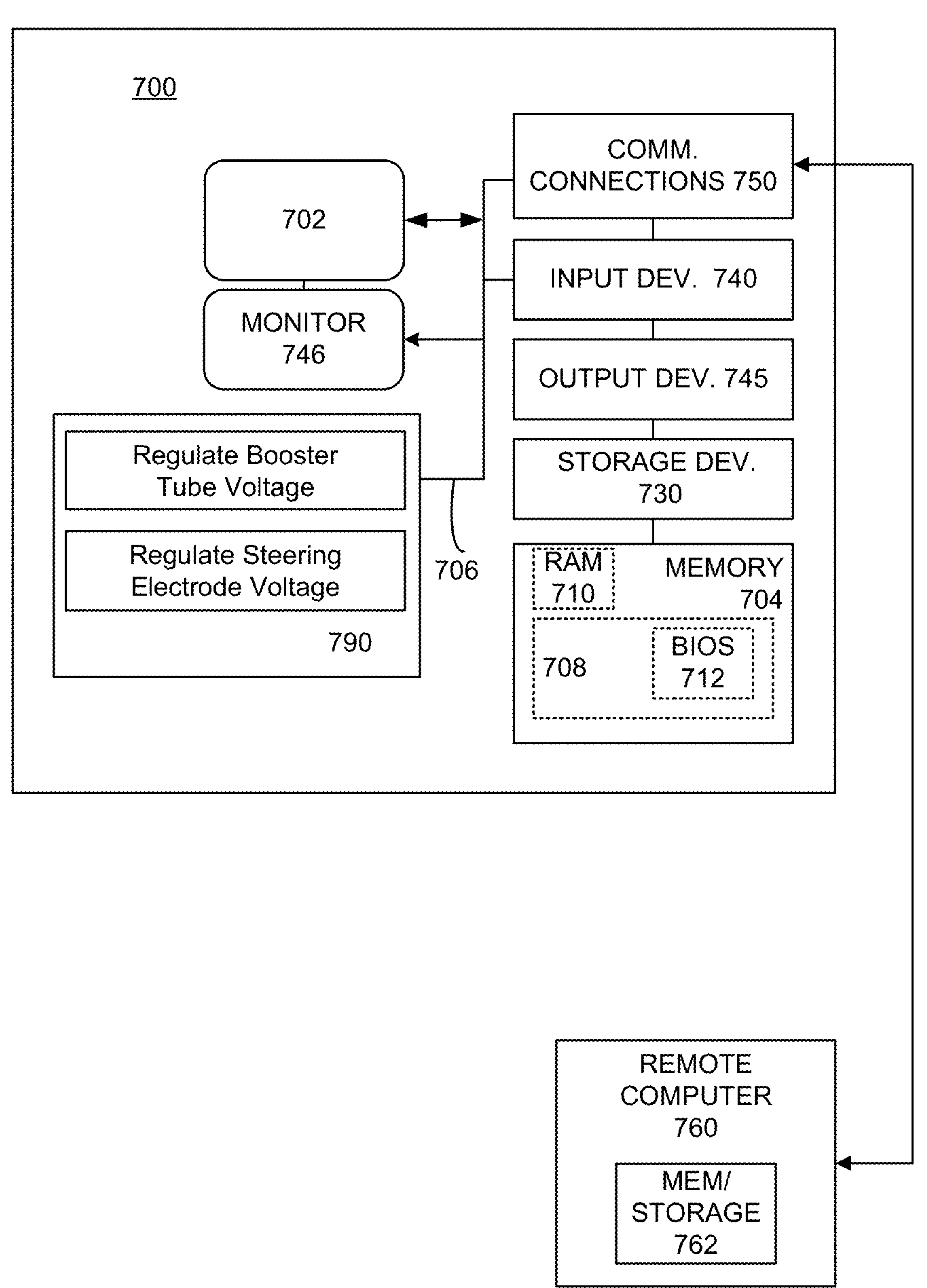
FIG. 7 is a schematic representation of a computing system that may be used to perform one or more methods of the present disclosure according to an example.

FIG. 7 and the following discussion are intended to provide a brief, general description of an exemplary computing environment in which the disclosed technology may be implemented. For example, one or more aspects of the computing system of FIG. 7 may represent and/or correspond to the controller 180 of FIG. 1. In particular, some or all portions of this computing environment can be used with the above methods and apparatus to, for example, position a sample probe relative to a sample test location, control a charged particle microscope system to image a sample probe relative to a sample test location, control an objective lens of a CPM system, and/or perform any portions of the methods disclosed above.

Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, tablets, multiprocessor systems, microprocessor-based or programmable consumer electronics, network PCs, minicomputers, mainframe computers, virtual machines, containerized applications, and the like. The disclosed technology also may be practiced in distributed computing environments where tasks are performed by remote processing devices that are linked through a communications network. In a distributed computing environment, program modules may be located in both local and remote memory storage devices. In some cases, such processing is provided in a CPM system. The disclosed systems can serve to control image acquisition and provide a user interface as well as serve as an image processor.

With reference to FIG. 7, an exemplary system for implementing the disclosed technology includes a general-purpose computing device in the form of an exemplary PC 700, including one or more processing units 702, a system memory 704, and a system bus 706 that couples various system components including the system memory 704 to the one or more processing units 702. The system bus 706 may be any of several types of bus structures including a memory bus or memory controller, a peripheral bus, and a local bus using any of a variety of bus architectures. The exemplary system memory 704 includes read-only memory (ROM) 708 and random-access memory (RAM) 710. A basic input/output system (BIOS) 712, containing the basic routines that help with the transfer of information between elements within the PC 700, is stored in ROM 708. The PC 700 may represent and/or correspond to the controller 180 of FIG. 1.

The exemplary PC 700 further includes one or more storage devices 730 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 706 by a hard disk drive interface, a magnetic disk drive interface, and an optical drive interface, respectively. The drives and their associated computer readable media provide nonvolatile storage of computer-readable instructions, data structures, program modules, and other data for the PC 700. Other types of computer-readable media which can store data that is accessible by a PC, such as magnetic cassettes, flash memory cards, solid-state drives, digital video disks, CDs, DVDs, RAMs, ROMs, and the like, may also be used in the exemplary operating environment. A number of program modules may be stored in the storage devices 730 including an operating system, multiple operating systems, virtual operating systems, one or more application programs, other program modules, and/or program data.

The exemplary PC 700 can include various devices configured for user interface. For example, a user may enter commands and information into the PC 700 through one or more input devices 740 such as a keyboard and/or a pointing device such as a mouse. For example, the user may enter commands to initiate image acquisition and/or to initiate one or more methods disclosed herein. Other input devices may include a digital camera, microphone, joystick, game pad, buttons, dials, satellite dish, scanner, or the like. These and other input devices are often connected to the one or more processing units 702 through a serial port interface that is coupled to the system bus 706, but may be connected by other interfaces such as a parallel port, game port, universal serial bus (USB), or wired or wireless network connection. A monitor 746 or other type of display device is also connected to the system bus 706 via an interface, such as a video adapter, and can display, for example, one or more images of a sample or specimen prior to, subsequent to, and/or during performance of one or more methods disclosed herein. The monitor 746 can also be used to select sections for processing or particular image alignment and alignment procedures such as correlation, feature identification, and preview area selection or other image selection. Other peripheral output devices, such as speakers and printers (not shown), may be included.

The PC 700 may operate in a networked environment using logical connections to one or more remote computers, such as a remote computer 760. In some examples, one or more network or communication connections 750 are included. The remote computer 760 may be another PC, a server, a router, a network PC, and/or a peer device or other common network node, and typically includes many or all of the elements described above relative to the PC 700, although only a memory storage device 762 has been illustrated in FIG. 7. The personal computer 700 and/or the remote computer 760 can be connected to a local area network (LAN) and/or a wide area network (WAN). Such networking environments are commonplace in offices, enterprise wide computer networks, intranets, and the Internet.

As shown in FIG. 7, a memory 790 (or portions of this or other memory) can store processor-executable instructions for regulating the booster tube voltage, for regulating the steering electrode voltage, and/or for any other processes described herein. For example, such processor-executable instructions can, when executed by a processor system, cause the PC 700 and/or another component (e.g., any suitable components of the CPM system 100 of FIG. 1A, the objective lens 250 of FIG. 2, and/or the objective lens 350 of FIG. 3) to execute any of the methods disclosed herein. In addition, the memory 790 can include processor-executable instructions for setting cross-correlations, image alignment such as image rotation and translation, selection of reference images and regions of interest, and/or recording stage coordinates for alignment. In some examples, processor-executable instructions can produce displayed images showing section identification, processing of preview images, and/or acquisition of additional images.

General Considerations

As used in this application and in the claims, the singular forms “a,” “an,” and “the” include the plural forms unless the context clearly dictates otherwise. Additionally, the term "includes" means "comprises." Further, the term "coupled" does not exclude the presence of intermediate elements between the coupled items.

Unless otherwise stated, as used herein, the term "substantially" means the listed value and/or property and any value and/or property that is at least 75% of the listed value and/or property. Equivalently, the term "substantially" means the listed value and/or property and any value and/or property that differs from the listed value and/or property by at most 25%. For example, "substantially equal" refers to quantities that are fully equal, as well as to quantities that differ from one another by up to 25%.

The systems, apparatus, and methods described herein should not be construed as limiting in any way. Instead, the present disclosure is directed toward all novel and non-obvious features and aspects of the various disclosed examples, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, and the like may be characterized by qualifying terms such as "lowest," "best," "minimum," "extreme," etc. It is to be understood that such descriptions are intended to indicate that a selection among many used functional alternatives can be made, and such selections need not be better, smaller, or otherwise preferable to other selections.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various examples. Computer-executable instructions for program modules may be executed within a local or distributed computing system. In general, a computing system or computing device can be local or distributed, and can include any combination of special-purpose hardware and/or general-purpose hardware with software implementing the functionality described herein, examples of which include personal computers, hand-held devices, tablets, multiprocessor systems, microprocessor-based or programmable consumer electronics, network PCs, minicomputers, mainframe computers, virtual machines, containerized applications, etc.

In various examples described herein, a module (e.g., component or engine) can be "programmed" and/or "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

Described algorithms may be, for example, embodied as software or firmware instructions carried out by a digital computer. For instance, any of the disclosed methods can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid-state drives (e.g., Flash drives)). The one or more processors can execute computer-executable instructions stored on one or more of the tangible, non-transitory computer-readable media, and thereby perform any of the disclosed techniques. For instance, software for performing any of the disclosed examples can be stored on the one or more volatile, non-transitory computer-readable media as computer-executable instructions, which when executed by the one or more processors, cause the one or more processors to perform any of the disclosed techniques or subsets of techniques.

Additional Examples of the Disclosed Technology

Having described and illustrated the principles of the disclosed technology with reference to the illustrated examples, it will be recognized that the illustrated examples can be modified in arrangement and detail without departing from such principles. For instance, elements of examples performed in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

Example 1. An apparatus, comprising: an objective lens, comprising: a lens body extending circumferentially around a lens central axis of the objective lens; a shielding electrode disposed within a downstream end region of the lens body and configured to at least partially shield a test region downstream of the objective lens from a lens electrostatic field generated within the objective lens; and a steering electrode disposed within the downstream end region of the lens body and upstream of the shielding electrode, wherein the objective lens is configured such that varying a steering electrode voltage that is applied to the steering electrode adjusts a location of a main objective plane of the objective lens in a downstream direction to increase a focal working distance of the objective lens.

Example 2. The apparatus of any example herein, particularly example 1, further comprising a booster tube extending around the lens central axis upstream of each of the shielding electrode and the steering electrode, wherein the booster tube is configured to be maintained at a booster tube voltage to energize a charged particle beam traveling through the booster tube, and wherein the shielding electrode is configured to at least partially shield the test region from an electrostatic field generated by the booster tube.

Example 3. The apparatus of any example herein, particularly example 2, wherein the booster tube voltage is one or more of at least 5 kilovolts (kV), at least 7 kV, at least 10 kV, at most 12 kV, at most 8 kV, at most 6 kV, 5-8 kV, 7-12 kV, or 5-12 kV.

Example 4. The apparatus of any example herein, particularly any one of examples 1-3, wherein the objective lens is configured to focus a charged particle beam to a focus location corresponding to a sample such that one or more of: (i) the focal working distance of the objective lens, as measured between the objective lens and the focus location along a direction parallel to the lens central axis, is one or more of at least 1 millimeter (mm), at least 2 mm, at least 5 mm, at least 10 mm, at most 15 mm, at most 7 mm, at most 3 mm, at most 1.5 mm, 1-3 mm, 2-7 mm, 5-15 mm, 1-7 mm, 3-15 mm, or 1-15 mm; (ii) the charged particle beam has a landing energy, as measured at the focus location, that is one or more of at least 10 electron-volts (eV), at least 20 eV, at least 30 eV, at 50 eV, at least 70 eV, at least 90 eV, at least 120 eV, at most 150 eV, at most 100 eV, at most 80 eV, at most 60 eV, at most 40 eV, at most 25 eV, at most 15 eV, 10-25 eV, 20-40 eV, 30-60 eV, 50-80 eV, 70-100 eV, 90-150 eV, 10-40 eV, 20-60 eV, 30-80 eV, 50-100 eV, 70-150 eV, 10-60 eV, 20-80 eV, 30-100 eV, 50-150 eV, 10-80 eV, 20-100 eV, 30-150 eV, 10-100 eV, 20-150 eV, or 10-150 eV; (iii) the lens electrostatic field has an axial electric field strength, as measured at the focus location in a direction parallel to the lens central axis, that is one or more of at least 70 volts per millimeter (V/mm), at least 90 V/mm, at least 120 V/mm, at least 140 V/mm, at least 160 V/mm, at most 175 V/mm, at most 150 V/mm, at most 130 V/mm, at most 100 V/mm, at most 80 V/mm, 70-100 V/mm, 90-130 V/mm, 120-150 V/mm, 140-175 V/mm, 70-130 V/mm, 90-150 V/mm, 120-175 V/mm, 70-150 V/mm, 90-175 V/mm, or 70-175 V/mm; or (iv) the charged particle beam has a characteristic beam diameter, corresponding to a diameter of a circle perpendicular to the lens central axis at the focus location that contains 50% of the charged particles of the charged particle beam at the focus location, that is one or more of at least 1 nanometer (nm), at least 3 nm, at least 5 nm, at least 10 nm, at least 15 nm, at least 20 nm, at least 30 nm, at most 40 nm, at most 25 nm, at most 17 nm, at most 12 nm, at most 7 nm, at most 2 nm, 1-7 nm, 3-12 nm, 5-17 nm, 10-25 nm, 15-40 nm, 1-12 nm, 3-17 nm, 5-25 nm, 10-40 nm, 1-17 nm, 3-25 nm, 5-40 nm, 1-25 nm, 3-40 nm, or 1-40 nm.

Example 5. The apparatus of any example herein, particularly any one of examples 1-4, wherein the shielding electrode is configured to be maintained at an electrical ground.

Example 6. The apparatus of any example herein, particularly any one of examples 1-5, wherein the shielding electrode is directly coupled to the lens body.

Example 7. The apparatus of any example herein, particularly any one of examples 1-6, wherein the shielding electrode is electrically coupled to the lens body.

Example 8. The apparatus of any example herein, particularly any one of examples 1-7, wherein the shielding electrode extends circumferentially around the lens central axis.

Example 9. The apparatus of any example herein, particularly any one of examples 1-8, wherein the shielding electrode is circumferentially symmetric about the lens central axis.

Example 10. The apparatus of any example herein, particularly any one of examples 1-9, wherein the shielding electrode comprises a shielding electrode aperture through which the lens central axis extends.

Example 11. The apparatus of any example herein, particularly example 10, wherein the shielding electrode comprises a shielding electrode central region that comprises the shielding electrode aperture and a shielding electrode peripheral region radially exterior of the shielding electrode central region, and wherein the shielding electrode central region extends away from the shielding electrode peripheral region along the downstream direction.

Example 12. The apparatus of any example herein, particularly example 11, wherein the shielding electrode central region is frusto-conical in shape.

Example 13. The apparatus of any example herein, particularly any one of examples 11-12, wherein the shielding electrode is coupled to the lens body at the shielding electrode peripheral region.

Example 14. The apparatus of any example herein, particularly any one of examples 11-13, wherein the steering electrode central region extends beyond the lens body in the downstream direction.

Example 15. The apparatus of any example herein, particularly any one of examples 1-14, wherein the steering electrode voltage is one or more of at least 500 V, at least 1000 V, at least 1500 V, at least 2000 V, at most 2500 V, at most 1700 V, at most 1200 V, at most 700 V, 500-1200 V, 1000-1700 V, 1500-2500 V, 500-1700 V, 1000-2500 V, or 500-2500 V.

Example 16. The apparatus of any example herein, particularly any one of examples 1-15, wherein the steering electrode is electrically isolated from the lens body.

Example 17. The apparatus of any example herein, particularly any one of examples 1-16, wherein the steering electrode is electrically isolated from the shielding electrode.

Example 18. The apparatus of any example herein, particularly any one of examples 1-17, wherein the steering electrode extends circumferentially around the lens central axis.

Example 19. The apparatus of any example herein, particularly any one of examples 1-18, wherein the steering electrode is circumferentially symmetric about the lens central axis.

Example 20. The apparatus of any example herein, particularly any one of examples 1-19, wherein the steering electrode comprises a steering electrode aperture through which the lens central axis extends.

Example 21. The apparatus of any example herein, particularly example 20, wherein the steering electrode comprises a steering electrode central region that comprises the steering electrode aperture and a steering electrode peripheral region radially exterior of the steering electrode central region, and wherein the steering electrode central region extends away from the steering electrode peripheral region along the downstream direction.

Example 22. The apparatus of any example herein, particularly example 21, wherein the steering electrode central region is frusto-conical in shape.

Example 23. The apparatus of any example herein, particularly any one of examples 21-22, wherein the steering electrode is coupled to the shielding electrode via the steering electrode peripheral region.

Example 24. The apparatus of any example herein, particularly any one of examples 20-23, wherein the shielding electrode comprises a shielding electrode central region that comprises a shielding electrode aperture and a shielding electrode peripheral region radially exterior of the shielding electrode central region, and wherein at least a portion of the steering electrode central region is received within the shielding electrode central region.

Example 25. The apparatus of any example herein, particularly any one of examples 1-24, further comprising an electrode standoff that couples the shielding electrode and the steering electrode to one another.

Example 26. The apparatus of any example herein, particularly example 25, wherein the electrode standoff supports the steering electrode relative to the shielding electrode.

Example 27. The apparatus of any example herein, particularly any one of examples 25-26, wherein the electrode standoff comprises an electrically insulating material.

Example 28. An objective lens, comprising: a shielding electrode; and a steering electrode, wherein the objective lens is configured to generate a lens electrostatic field to at least partially direct a charged particle beam along an optical axis to a focus location with a landing energy, as measured at the focus location, that is at most 100 eV, wherein the shielding electrode is configured to at least partially shield a test region downstream of the objective lens such that the lens electrostatic field has an axial electric field strength, as measured at the focus location in a direction parallel to the optical axis, that is at most 150 volts per millimeter (V/mm), and wherein the steering electrode is configured to generate at least a portion of the lens electrostatic field such that the objective lens operates with a focal working distance, as measured between the objective lens and the focus location along a direction parallel to a lens central axis of the objective lens, that is 1-3 millimeters (mm).

Example 29. The objective lens of any example herein, particularly example 28, wherein the steering electrode is at least partially supported by the shielding electrode.

Example 30. The objective lens of any example herein, particularly any one of examples 28-29, further comprising an electrode standoff that is directly coupled to each of the shielding electrode and the steering electrode.

Example 31. The objective lens of any example herein, particularly any one of examples 28-30, wherein the steering electrode is at least partially received within the shielding electrode.

Example 32. A charged particle microscope (CPM) system comprising: a charged particle source configured to emit a charged particle beam along an optical axis and toward a sample; and an objective lens configured to focus the charged particle beam to a focus location corresponding to a location of the sample, wherein the objective lens comprises the objective lens of any example herein, particularly any one of examples 1-31.

Example 33. The CPM system of any example herein, particularly example 32, further comprising a booster tube extending around the lens central axis upstream of each of the shielding electrode and the steering electrode, wherein the booster tube is configured to be maintained at a booster tube voltage to energize the charged particle beam.

Example 34. The CPM system of any example herein, particularly example 33, wherein the booster tube generates at least a portion of the lens electrostatic field when the booster tube voltage is applied to the booster tube.

Example 35. The CPM system of any example herein, particularly any one of examples 33-34, wherein the CPM system is configured such that the charged particle beam decelerates upon exiting the booster tube.

Example 36. The CPM system of any example herein, particularly any one of examples 32-35, further comprising a sample probe configured to be positioned proximate to a sample test location of the sample, and wherein the shielding electrode is configured to shield the sample probe from the lens electrostatic field.

Example 37. The CPM system of any example herein, particularly example 36, wherein the sample probe comprises a probe tip configured to be positioned proximate to the sample test location and a probe beam extending away from the probe tip.

Example 38. The CPM system of any example herein, particularly example 37, further comprising a probe manipulator configured to move the sample probe relative to the sample to position the sample probe proximate to the sample test location, wherein the probe beam extends between the probe tip and the probe manipulator.

Example 39. The CPM system of any example herein, particularly any one of examples 37-38, wherein the probe tip is angled relative to the probe beam toward a sample holder that is configured to support the sample.

Example 40. The CPM system of any example herein, particularly any one of examples 36-39, wherein the sample probe is configured to directly contact the sample test location.

Example 41. The CPM system of any example herein, particularly any one of examples 36-40, wherein the sample probe is configured to be electrically coupled to the sample test location.

Example 42. The CPM system of any example herein, particularly any one of examples 36-39, wherein the sample probe is configured to be spaced apart from the sample test location during operative use of the sample probe.

Example 43. The CPM system of any example herein, particularly any one of examples 36-42, wherein the sample probe is configured to be optically coupled to the sample test location.

Example 44. The CPM system of any example herein, particularly any one of examples 32-43, wherein the charged particle beam comprises an electron beam, and wherein the CPM system is configured to operate as a scanning electron microscope (SEM).

Example 45. The CPM system of any example herein, particularly any one of examples 32-44, further comprising one or more electron detectors configured to detect electrons emitted from the sample.

Example 46. The CPM system of any example herein, particularly example 45, wherein the one or more electron detectors comprises a backscattered electron (BSE) detector configured to detect backscattered electrons generated via an interaction between the charged particle beam and the sample.

Example 47. The CPM system of any example herein, particularly example 46, wherein the BSE detector is positioned at least partially within the objective lens.

Example 48. The CPM system of any example herein, particularly any one of examples 46-47, further comprising a booster tube extending around the lens central axis upstream of each of the shielding electrode and the steering electrode, wherein the booster tube is configured to be maintained at a booster tube voltage to energize the charged particle beam, and wherein the booster tube draws electrons toward the BSE detector.

Example 49. The CPM system of any example herein, particularly any one of examples 45-48, wherein the one or more electron detectors comprises a secondary electron (SE) detector configured to detect secondary electrons generated via an interaction between the charged particle beam and the sample.

Example 50. The CPM system of any example herein, particularly any one of examples 32-49, further comprising one or more scan coils configured to deflect the charged particle beam to scan the charged particle beam across the sample.

Example 51. The CPM system of any example herein, particularly any one of examples 32-50, further comprising a condenser lens configured to converge the charged particle beam toward the sample.

Example 52. The CPM system of any example herein, particularly any one of examples 32-51, further comprising a controller configured to at least partially control operation of the CPM system.

Example 53. The CPM system of any example herein, particularly example 52, wherein the controller is configured to at least partially control operation of the objective lens.

Example 54. The CPM system of any example herein, particularly any one of examples 52-53, further comprising a booster tube extending around the lens central axis upstream of each of the shielding electrode and the steering electrode, wherein the booster tube is configured to be maintained at a booster tube voltage to energize the charged particle beam, and optionally wherein the controller is configured to selectively vary the booster tube voltage.

Example 55. The CPM system of any example herein, particularly example 54, wherein the controller comprises a first voltage source configured to apply the booster tube voltage to the booster tube.

Example 56. The CPM system of any example herein, particularly any one of examples 52-55, wherein the controller is configured to selectively vary the steering electrode voltage applied to the steering electrode.

Example 57. The CPM system of any example herein, particularly any one of examples 52-56, wherein the controller comprises a second voltage source configured to apply the steering electrode voltage to the steering electrode.

Example 58. The CPM system of any example herein, particularly any one of examples 52-57, wherein the controller is configured to regulate a shielding electrode voltage applied to the shielding electrode.

Example 59. The CPM system of any example herein, particularly any one of examples 52-58, wherein the controller comprises a third voltage source configured to apply the shielding electrode voltage to the shielding electrode.

Example 60. The CPM system of any example herein, particularly example 59, wherein the third voltage source comprises an electrical ground.

Example 61. The CPM system of any example herein, particularly any one of examples 52-60, wherein the controller comprises one or more input devices for receiving inputs from a human user to at least partially direct operation of the CPM system.

Example 62. The CPM system of any example herein, particularly any one of examples 52-61, wherein the controller comprises one or more output devices for conveying information to a human user.

Example 63. A method, comprising: positioning a sample relative to an objective lens that is configured to focus a charged particle beam to a focus location; and operating the objective lens, optionally wherein the objective lens is the objective lens of any example herein, particularly any one of examples 1-62.

Example 64. The method of any example herein, particularly example 63, wherein the positioning the sample comprises positioning such that at least a portion of the sample is positioned at the focus location.

Example 65. The method of any example herein, particularly any one of examples 63-64, wherein the positioning the sample comprises positioning such that the focal working distance, as measured between the objective lens and the focus location along a direction parallel to the lens central axis, is one or more of at least 1 millimeter (mm), at least 2 mm, at least 5 mm, at least 10 mm, at most 15 mm, at most 7 mm, at most 3 mm, at most 1.5 mm, 1-3 mm, 2-7 mm, 5-15 mm, 1-7 mm, 3-15 mm, or 1-15 mm.

Example 66. The method of any example herein, particularly any one of examples 63-65, wherein the objective lens is comprised in a CPM system that is configured to direct the charged particle beam along an optical axis and toward the sample, and wherein the method comprises operating the CPM system such that a landing energy of the charged particle beam, as measured at the focus location, is one or more of at least 5 eV, at least 10 eV, at least 20 eV, at least 30 eV, at 50 eV, at least 70 eV, at least 90 eV, at least 120 eV, at most 200 eV, at most 150 eV, at most 100 eV, at most 80 eV, at most 60 eV, at most 40 eV, at most 25 eV, at most 15 eV, at most 7 eV, 5-15 eV, 10-25 eV, 20-40 eV, 30-60 eV, 50-80 eV, 70-100 eV, 90-150 eV, 120-200 eV, 5-25 eV, 10-40 eV, 20-60 eV, 30-80 eV, 50-100 eV, 70-150 eV, 90-200 eV, 5-40 eV, 10-60 eV, 20-80 eV, 30-100 eV, 50-150 eV, 70-200 eV, 5-60 eV, 10-80 eV, 20-100 eV, 30-150 eV, 50-200 eV, 5-80 eV, 10-100 eV, 20-150 eV, 30-200 eV, 5-100 eV, 10-150 eV, 20-200 eV, 5-150 eV, 10-200 eV, or 5-200 eV.

Example 67. The method of any example herein, particularly any one of examples 63-66, wherein the objective lens is comprised in a CPM system that is configured to direct the charged particle beam along an optical axis and toward the sample, and wherein the method comprises operating the CPM system such that the charged particle beam has a characteristic beam diameter, corresponding to a diameter of a circle perpendicular to the lens central axis at the focus location that contains 50% of the charged particles of the charged particle beam at the focus location, that is one or more of at least 1 nm, at least 3 nm, at least 5 nm, at least 10 nm, at least 15 nm, at least 20 nm, at least 30 nm, at most 40 nm, at most 25 nm, at most 17 nm, at most 12 nm, at most 7 nm, at most 2 nm, 1-7 nm, 3-12 nm, 5-17 nm, 10-25 nm, 15-40 nm, 1-12 nm, 3-17 nm, 5-25 nm, 10-40 nm, 1-17 nm, 3-25 nm, 5-40 nm, 1-25 nm, 3-40 nm, or 1-40 nm.

Example 68. The method of any example herein, particularly any one of examples 66-67, wherein the CPM system is the CPM system of any example herein, particularly any one of examples 32-62.

Example 69. The method of any example herein, particularly any one of examples 63-68, wherein the operating the objective lens comprises operating such that the lens electrostatic field has an axial electric field strength, as measured at the focus location in a direction parallel to the lens central axis, that is one or more of at least 70 volts per millimeter (V/mm), at least 90 V/mm, at least 120 V/mm, at least 140 V/mm, at least 160 V/mm, at most 175 V/mm, at most 150 V/mm, at most 130 V/mm, at most 100 V/mm, at most 80 V/mm, 70-100 V/mm, 90-130 V/mm, 120-150 V/mm, 140-175 V/mm, 70-130 V/mm, 90-150 V/mm, 120-175 V/mm, 70-150 V/mm, 90-175 V/mm, or 70-175 V/mm.

Example 70. The method of any example herein, particularly any one of examples 63-69, wherein the operating the objective lens comprises generating the lens electrostatic field.

Example 71. The method of any example herein, particularly example 70, wherein the generating the lens electrostatic field comprises applying the steering electrode voltage to the steering electrode.

Example 72. The method of any example herein, particularly any one of examples 70-71, wherein the steering electrode voltage is one or more of at least 500 V, at least 1000 V, at least 1500 V, at least 2000 V, at most 2500 V, at most 1700 V, at most 1200 V, at most 700 V, 500-1200 V, 1000-1700 V, 1500-2500 V, 500-1700 V, 1000-2500 V, or 500-2500 V.

Example 73. The method of any example herein, particularly any one of examples 70-72, further comprising applying a booster tube voltage to a booster tube extending around the lens central axis upstream of each of the shielding electrode and the steering electrode.

Example 74. The method of any example herein, particularly example 73, wherein the booster tube voltage is one or more of at least 5 kilovolts (kV), at least 7 kV, at least 10 kV, at most 12 kV, at most 8 kV, at most 6 kV, 5-8 kV, 7-12 kV, or 5-12 kV.

Example 75. The method of any example herein, particularly any one of examples 63-74, further comprising, prior to the operating the objective lens, assembling a CPM system that comprises the objective lens.

Example 76. The method of any example herein, particularly example 75, wherein the CPM system comprises a charged particle source configured to emit the charged particle beam along an optical axis, and wherein the assembling the CPM system comprises positioning the objective lens such that the optical axis extends through each of the shielding electrode and the steering electrode.

Example 77. The method of any example herein, particularly any one of examples 63-76, wherein the operating the objective lens comprises controlling a focal working distance between the objective lens and a focus location of a charged particle beam that is focused by the objective lens, and optionally wherein the controlling the focal working distance comprises applying the steering electrode voltage to the steering electrode.

Example 78. The method of any example herein, particularly example 77, wherein the operating the objective lens comprises generating the lens electrostatic field, wherein the generating the lens electrostatic field comprises applying the steering electrode voltage to the steering electrode, and wherein the controlling the focal working distance comprises adjusting the steering electrode voltage.

Example 79. The method of any example herein, particularly any one of examples 63-78, further comprising adjusting a landing energy of the charged particle beam at the focus location.

Example 80. The method of any example herein, particularly example 79, wherein the adjusting the landing energy comprises adjusting a source energy of a charged particle source of a CPM system that comprises the objective lens.

Example 81. The method of any example herein, particularly any one of examples 63-80, further comprising: positioning a sample probe proximate to a sample test location of the sample.

Example 82. The method of any example herein, particularly example 81, wherein the positioning the sample probe proximate to the sample test location comprises imaging one or both of the sample probe and the sample test location with a charged particle microscope system that comprises the objective lens.

Example 83. The method of any example herein, particularly any one of examples 81-82, wherein the positioning the sample probe comprises moving the sample probe relative to the sample with a probe manipulator that supports the sample probe relative to the sample.

Example 84. The method of any example herein, particularly any one of examples 81-83, wherein the positioning the sample probe comprises moving the sample relative to the sample probe.

Example 85. The method of any example herein, particularly any one of examples 63-84, wherein the objective lens is comprised in a CPM system that comprises a controller, and wherein the controller performs at least a portion of the method.

Example 86. The method of any example herein, particularly example 85, wherein the CPM system is the CPM system of any example herein, particularly any one of examples 32-62.

Example 87. The method of any example herein, particularly any one of examples 85-86, further comprising applying a booster tube voltage to a booster tube extending around the lens central axis upstream of each of the shielding electrode and the steering electrode, and wherein the applying the booster tube voltage is performed, at least in part, with the controller.

Example 88. The method of any example herein, particularly example 87, wherein the applying the booster tube voltage comprises applying the booster tube voltage to the booster tube with a first voltage source of the controller.

Example 89. The method of any example herein, particularly any one of examples 87-88, wherein the applying the booster tube voltage comprises selectively and/or dynamically regulating the booster tube voltage with the controller.

Example 90. The method of any example herein, particularly any one of examples 85-89, wherein the operating the objective lens comprises generating the lens electrostatic field, wherein the generating the lens electrostatic field comprises applying the steering electrode voltage to the steering electrode, and wherein the applying the steering electrode voltage is performed, at least in part, with the controller.

Example 91. The method of any example herein, particularly example 90, wherein the applying the steering electrode voltage comprises applying the steering electrode voltage with a second voltage source of the controller.

Example 92. The method of any example herein, particularly any one of examples 90-91, wherein the applying the steering electrode voltage comprises selectively and/or dynamically regulating the steering electrode voltage with the controller.

In view of the many possible examples in which the principles of the disclosed technology may be applied, it should be recognized that the illustrated examples are only preferred examples and should not be taken as limiting the scope of the disclosed technology. Rather, the scope is defined by the following claims. We therefore claim all that comes within the scope of these claims.

We claim:

1. An apparatus, comprising:

an objective lens, comprising:

a lens body extending circumferentially around a lens central axis of the objective lens;

a shielding electrode disposed within a downstream end region of the lens body and configured to at least partially shield a test region downstream of the objective lens from a lens electrostatic field generated within the objective lens; and a steering electrode disposed within the downstream end region of the lens body and upstream of the shielding electrode, wherein the objective lens is configured such that varying a steering electrode voltage that is applied to the steering electrode adjusts a location of a main objective plane of the objective lens in a downstream direction to increase a focal working distance of the objective lens.

2. The apparatus of claim 1, further comprising a booster tube extending around the lens central axis upstream of each of the shielding electrode and the steering electrode, wherein the booster tube is configured to be maintained at a booster tube voltage to energize a charged particle beam traveling through the booster tube, and wherein the shielding electrode is configured to at least partially shield the test region from an electrostatic field generated by the booster tube.

3. The apparatus of claim 1, wherein the objective lens is configured to focus a charged particle beam to a focus location corresponding to a sample such that:

(i) the focal working distance of the objective lens, as measured between the objective lens and the focus location along a direction parallel to the lens central axis, is 1-7 mm;

(ii) the charged particle beam has a landing energy, as measured at the focus location, that is 20-100 electronvolts (eV);

(iii) the lens electrostatic field has an axial electric field strength, as measured at the focus location in a direction parallel to the lens central axis, that is 70-150 volts per millimeter (V/mm); and (iv) the charged particle beam has a characteristic beam diameter, corresponding to a diameter of a circle perpendicular to the lens central axis at the focus location that contains 50% of the charged particles of the charged particle beam at the focus location, that is 1-7 nanometers (nm).

4. The apparatus of claim 1, wherein the shielding electrode comprises a shielding electrode aperture through which the lens central axis extends, wherein the shielding electrode comprises a shielding electrode central region that comprises the shielding electrode aperture and a shielding electrode peripheral region radially exterior of the shielding electrode central region, and wherein the shielding electrode central region extends away from the shielding electrode peripheral region along the downstream direction.

5. The apparatus of claim 1, wherein the steering electrode is electrically isolated from the shielding electrode.

6. The apparatus of claim 1, wherein the steering electrode comprises a steering electrode aperture through which the lens central axis extends, wherein the steering electrode comprises a steering electrode central region that comprises the steering electrode aperture and a steering electrode peripheral region radially exterior of the steering electrode central region, and wherein the steering electrode central region extends away from the steering electrode peripheral region along the downstream direction.

7. The apparatus of claim 6, wherein the steering electrode is coupled to the shielding electrode via the steering electrode peripheral region.

8. The apparatus of claim 6, wherein the shielding electrode comprises a shielding electrode central region that comprises a shielding electrode aperture and a shielding electrode peripheral region radially exterior of the shielding electrode central region, and wherein at least a portion of the steering electrode central region is received within the shielding electrode central region.

9. The apparatus of claim 1, further comprising:

a charged particle source configured to emit a charged particle beam along an optical axis and toward a sample;

wherein the objective lens is configured to focus the charged particle beam to a focus location corresponding to a location of the sample.

10. The apparatus of claim 9, further comprising a booster tube extending around the lens central axis upstream of each of the shielding electrode and the steering electrode, wherein the booster tube is configured to be maintained at a booster tube voltage to energize the charged particle beam, and wherein the booster tube generates at least a portion of the lens electrostatic field when the booster tube voltage is applied to the booster tube.

11. The apparatus of claim 9, further comprising a sample probe configured to be positioned proximate to a sample test location of the sample, and wherein the shielding electrode is configured to shield the sample probe from the lens electrostatic field.

12. The apparatus of claim 9, wherein the charged particle beam comprises an electron beam, and wherein the apparatus is configured to operate as a scanning electron microscope (SEM).

13. An objective lens, comprising:

a shielding electrode; and a steering electrode, wherein the objective lens is configured to generate a lens electrostatic field to at least partially direct a charged particle beam along an optical axis to a focus location with a landing energy, as measured at the focus location, that is at most 100 eV, wherein the shielding electrode is configured to at least partially shield a test region downstream of the objective lens such that the lens electrostatic field has an axial electric field strength, as measured at the focus location in a direction parallel to the optical axis, that is at most 150 volts per millimeter (V/mm), and wherein the steering electrode is configured to generate at least a portion of the lens electrostatic field such that the objective lens operates with a focal working distance, as measured between the objective lens and the focus location along a direction parallel to a lens central axis of the objective lens, that is 1-3 millimeters (mm).

14. The objective lens of claim 13, wherein the steering electrode is at least partially supported by the shielding electrode.

15. The objective lens of claim 13, wherein the steering electrode is at least partially received within the shielding electrode.

16. A method, comprising:

positioning a sample relative to an objective lens that is configured to focus a charged particle beam to a focus location; and operating the objective lens, wherein the objective lens comprises:

a lens body extending circumferentially around a lens central axis of the objective lens;

a shielding electrode disposed within a downstream end region of the lens body and configured to at least partially shield a test region downstream of the objective lens from a lens electrostatic field generated within the objective lens; and a steering electrode disposed within the downstream end region of the lens body and upstream of the shielding electrode, and wherein the operating the objective lens comprises controlling a focal working distance between the objective lens and the focus location by applying a steering electrode voltage to the steering electrode.

17. The method of claim 16, wherein the positioning the sample comprises positioning such that the focal working distance is 1-7 mm, and wherein the operating the objective lens comprises operating such that the lens electrostatic field has an axial electric field strength, as measured at the focus location in a direction parallel to the lens central axis, that is at most 150 V/mm.

18. The method of claim 16, wherein the objective lens is comprised in a charged particle microscope system that is configured to direct the charged particle beam along an optical axis and toward the sample, and wherein the operating the objective lens comprises operating such that:

(i) a landing energy of the charged particle beam, as measured at the focus location, is 5-200 eV; and (ii) the charged particle beam has a characteristic beam diameter, corresponding to a diameter of a circle perpendicular to the lens central axis at the focus location that contains 50% of the charged particles of the charged particle beam at the focus location, that is 1-7 mm.

19. The method of claim 16, further comprising generating the lens electrostatic field, wherein the generating the lens electrostatic field comprises applying the steering electrode voltage to the steering electrode, and wherein the controlling the focal working distance comprises adjusting the steering electrode voltage.

20. The method of claim 16, wherein the generating the lens electrostatic field comprises applying a booster tube voltage to a booster tube extending around the lens central axis upstream of each of the shielding electrode and the steering electrode, and wherein the booster tube voltage is 5-12 kilovolts (kV).

* * * * *